(12) United States Patent
Sekiguchi et al.

(10) Patent No.: US 10,040,960 B2
(45) Date of Patent: Aug. 7, 2018

(54) SILVER INK COMPOSITION, CONDUCTOR AND COMMUNICATION DEVICE

(71) Applicant: Toppan Forms Co., LTD., Minato-ku, Tokyo (JP)

(72) Inventors: Takuya Sekiguchi, Tokyo (JP); Keiko Omata, Tokyo (JP)

(73) Assignee: TOPPAN FORMS CO., LTD., Minato-Ku, Tokyo (JP)

( * ) Notice: Subject to any disclaimer, the term of this patent is extended or adjusted under 35 U.S.C. 154(b) by 530 days.

(21) Appl. No.: 14/431,092

(22) PCT Filed: Sep. 27, 2013

(86) PCT No.: PCT/JP2013/076295
§ 371 (c)(1),
(2) Date: Mar. 25, 2015

(87) PCT Pub. No.: WO2014/051066
PCT Pub. Date: Apr. 3, 2014

(65) Prior Publication Data
US 2015/0259557 A1 Sep. 17, 2015

(30) Foreign Application Priority Data

Sep. 28, 2012 (JP) .................................. 2012-218366
Sep. 28, 2012 (JP) .................................. 2012-218368
Feb. 27, 2013 (JP) .................................. 2013-037963
Sep. 5, 2013 (JP) .................................. 2013-184490
Sep. 5, 2013 (JP) .................................. 2013-184491

(51) Int. Cl.
*C09D 11/52* (2014.01)
*H05K 1/09* (2006.01)

(52) U.S. Cl.
CPC .............. *C09D 11/52* (2013.01); *H05K 1/092* (2013.01)

(58) Field of Classification Search
CPC ................................ C09D 11/52; H05K 1/092
USPC ............... 106/31.92; 252/514, 519.21, 520.3
See application file for complete search history.

(56) References Cited

U.S. PATENT DOCUMENTS

| | | | | |
|---|---|---|---|---|
| 7,683,195 B2 * | 3/2010 | Suganuma | ............... | C07C 51/00 427/255.28 |
| 9,469,773 B2 * | 10/2016 | Walker | ................. | C09D 11/52 |
| 2006/0130700 A1 * | 6/2006 | Reinartz | ................. | C09D 11/40 106/31.92 |
| 2008/0145560 A1 * | 6/2008 | Khaselev | ............... | C09D 11/52 252/514 |
| 2008/0206488 A1 * | 8/2008 | Chung | ................... | C09D 11/52 106/31.92 |
| 2009/0291230 A1 * | 11/2009 | Lin | ........................ | C09D 11/52 427/553 |
| 2013/0121872 A1 | 5/2013 | Matsumoto et al. | | |
| 2014/0026782 A1 * | 1/2014 | Chung | ................... | C09D 11/52 106/1.05 |
| 2015/0008376 A1 * | 1/2015 | Hirose | ................... | C09D 11/52 252/519.21 |
| 2015/0037550 A1 * | 2/2015 | Balasubramaniam | . | C09D 11/52 252/519.34 |
| 2015/0225588 A1 * | 8/2015 | Iguchi | ................... | H05K 1/097 106/31.92 |

FOREIGN PATENT DOCUMENTS

CN 1611805 A 9/2005
CN 101591488 A 12/2009
(Continued)

OTHER PUBLICATIONS

English translation of the Written Opinion of the International Search Authority dated Dec. 17, 2013 for PCT/JP2013/076295; 4 pages.*

(Continued)

*Primary Examiner* — Helene Klemanski
(74) *Attorney, Agent, or Firm* — Hoffmann & Baron, LLP

(57) ABSTRACT

There are provided a silver ink composition which is capable of forming metallic silver having sufficient electrical conductivity without carrying out a heat treatment at high temperatures; and a conductor and communication device which are obtained using this silver ink composition. Such a silver ink composition is characterized by being obtained by blending: a silver carboxylate having a group represented by a formula "—COOAg"; one or more nitrogen-containing compounds selected from the group consisting of amine compounds and quaternary ammonium salts of not more than 25 carbon atoms, ammonia, and ammonium salts obtained by reacting the above amine compounds or ammonia with an acid; and one or more reducing compounds selected from the group consisting of oxalic acid, hydrazine and compounds represented by a general formula (5) shown below (in the formula, $R^{21}$ represents an alkyl group, alkoxy group or N,N-dialkylamino group of not more than 20 carbon atoms, a hydroxyl group or an amino group): or obtained by preparing a second mixture by supplying carbon dioxide to a first mixture formed by mixing a silver carboxylate having a group represented by a formula "—COOAg" and one or more nitrogen-containing compounds selected from the group consisting of amine compounds and quaternary ammonium salts of not more than 25 carbon atoms, ammonia, and ammonium salts obtained by reacting the amine compounds or ammonia with an acid; and further mixing one or more reducing compounds selected from the group consisting of oxalic acid, hydrazine and compounds represented by a general formula (5) shown below to the mixture: $H—C(=O)—R^{21}$ (5).

20 Claims, No Drawings

(56) References Cited

FOREIGN PATENT DOCUMENTS

| | | | |
|---|---|---|---|
| CN | 101870832 A | * | 10/2010 |
| CN | 102321402 A | | 1/2012 |
| CN | 103476880 A | | 12/2013 |
| CN | 104520033 A | | 4/2015 |
| EP | 1088862 A1 | | 4/2001 |
| JP | 2008531810 A | | 8/2008 |
| JP | 2009114232 A | | 5/2009 |
| JP | 2009197133 A | | 9/2009 |
| JP | 2012069273 A | | 4/2012 |
| JP | 2012/234803 A | * | 11/2012 |
| WO | WO2006066033 A1 | | 6/2006 |
| WO | 2006093398 A1 | | 9/2006 |
| WO | 2012014933 A1 | | 2/2012 |
| WO | 2012144610 A1 | | 10/2012 |
| WO | WO 2013/096664 A1 | * | 6/2013 |

OTHER PUBLICATIONS

English translation of JP 2009/197133, Sep. 2009; 25 pages.*
English translation of CN 102321402, Jan. 2012; 15 pages.*
English translation of JP 2012/234803, Nov. 2012; 32 pages.*
English translation of CN 101870832, Oct. 2010; 10 pages.*
Walker et al.; "Reactive Silver Inks for Patterning High-Conductivity Features at Mild Temperatures"; Journal of The American Chemical Society, pubs.acs.org/JACS; Oct. 1, 2011.*
International Search Report, PCT/JP2013/076295, dated Dec. 17, 2013.
Second Office Action from corresponding Chinese Patent Application No. 201380050122.5, dated May 16, 2016.
Office Action from corresponding Chinese Application No. 201380050122.5, pp. 1-17, dated Nov. 18, 2016.

* cited by examiner

SILVER INK COMPOSITION, CONDUCTOR AND COMMUNICATION DEVICE

TECHNICAL FIELD

The present invention relates to a silver ink composition capable of forming metallic silver having sufficient electrical conductivity without carrying out a heat treatment at high temperatures; and a conductor and communication device which are obtained by using this silver ink composition.

This application is the U.S. National Phase of, and Applicants claim priority from, International Patent Application Number PCT/JP2013/076295, filed Sep. 27, 2013, which claims priority from Japanese Patent Application Nos. JP2012-218366, filed Sep. 28, 2012; JP2012-218368, filed Sep. 28, 2012; JP2013-037963, filed Feb. 27, 2013; JP2013-184490, filed Sep. 5, 2013; and JP2013-184491, filed Sep. 5, 2013. The contents of these applications are hereby incorporated by reference in their entireties.

BACKGROUND ART

Metallic silver has been widely used as a recording material and a material of printing plate, and also as a highly conductive material because of its excellent electrical conductivity.

As a general method for producing metallic silver to date, for example, a method of using silver salts of organic acid, such as silver behenate, silver stearate, silver α-ketocarboxylate and silver β-ketocarboxylate, has been disclosed. For example, silver β-ketocarboxylate rapidly forms metallic silver even when subjected to a heat treatment at a low temperature of about 210° C. or less (see Patent Document 1). A method of forming metallic silver has been disclosed by taking advantage of such an excellent property and by dissolving silver β-ketocarboxylate in a solvent to prepare a silver ink composition, printing it on a substrate, and subjecting the resulting printed material to a heat (baking) treatment (see Patent Document 1).

On the other hand, for the heat treatment at the time of forming metallic silver, further reduction in the heating temperature has been expected. The reasons for this are that because, as the heating temperature reduces, the number of restrictions concerning the material of the substrate for printing the silver ink composition and carrying out a heat treatment is reduced, a substrate made of a material that is not highly heat resistant can also be used, and the range of use of the silver ink composition greatly expands. For example, in the case of using such a material that is not highly heat resistant for the housing of a communication device, the degree of freedom of design of the communication device is dramatically improved, such that it becomes possible to use a portion of the housing as a substrate for electronic circuits.

On the other hand, a method of forming a metallic silver coating film by applying a liquid composition formed by mixing silver formate and an amine compound onto a substrate and carrying out a heat treatment at 90° C. has been disclosed (see Patent Document 2).

CITATION LIST

Patent Documents

Patent Document 1: Japanese Unexamined Patent Application, First Publication No. 2009-114232

Patent Document 2: Japanese Unexamined Patent Application, First Publication No. 2012-069273

SUMMARY OF INVENTION

Problem to be Solved by that the Invention

However, in the method described in Patent Document 2, since the silver concentration of the liquid composition is extremely low, in order to form metallic silver having sufficient electrical conductivity, it is necessary to carry out the application of the liquid composition repeatedly, and there have been problems of low utility and substantial difficulty in forming metallic silver with sufficient electrical conductivity. As described above, the actual situation is that a silver ink composition capable of forming metallic silver with sufficient electrical conductivity by a heat treatment at a lower temperature has not been disclosed to date.

The present invention has been developed in light of the above circumstances, and has an object of providing a silver ink composition capable of forming metallic silver having sufficient electrical conductivity without carrying out a heat treatment at high temperatures, and a conductor and communication device which are obtained using this silver ink composition.

Means for Solving the Problem

In order to solve the above problems, the present invention provides a silver ink composition which includes: a silver carboxylate having a group represented by a formula "—COOAg"; one or more nitrogen-containing compounds selected from the group consisting of amine compounds and quaternary ammonium salts of not more than 25 carbon atoms, ammonia, and ammonium salts obtained by reacting the aforementioned amine compounds or ammonia with an acid; and one or more reducing compounds selected from the group consisting of oxalic acid, hydrazine and compounds represented by a general formula (5) shown below:

$$H\text{—}C(=O)\text{—}R^{21} \qquad (5)$$

(in the formula, $R^{21}$ represents an alkyl group, alkoxy group or N,N-dialkylamino group of not more than 20 carbon atoms, a hydroxyl group or an amino group.)

In the silver ink composition of the present invention, it is preferable that the aforementioned silver carboxylate be at least one member selected from the group consisting of silver β-ketocarboxylates represented by a general formula (1) shown below and silver carboxylates represented by a general formula (4) shown below.

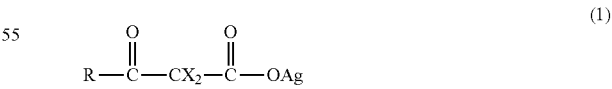

$$R\text{—}\overset{O}{\underset{\|}{C}}\text{—}CX_2\text{—}\overset{O}{\underset{\|}{C}}\text{—}OAg \qquad (1)$$

(In the formula, R represents an aliphatic hydrocarbon group or phenyl group of 1 to 20 carbon atoms in which one or more hydrogen atoms may be substituted with a substituent, a hydroxyl group, an amino group or a group represented by a general formula "$R^1\text{—}CY_2\text{—}$", "$CY_3\text{—}$", "$R^1\text{—}CHY\text{—}$", "$R^2O\text{—}$", "$R^5R^4N\text{—}$", "$(R^3O)_2CY\text{—}$" or "$R^6\text{—}C(=O)\text{—}CY_2\text{—}$";

each Y independently represents a fluorine atom, a chlorine atom, a bromine atom or a hydrogen atom; $R^1$ represents an aliphatic hydrocarbon group of 1 to 19 carbon atoms or a phenyl group; $R^2$ represents an aliphatic hydrocarbon group of 1 to 20 carbon atoms; $R^3$ represents an aliphatic hydrocarbon group of 1 to 16 carbon atoms; each of $R^4$ and $R^5$ independently represents an aliphatic hydrocarbon group of 1 to 18 carbon atoms; and $R^6$ represents an aliphatic hydrocarbon group of 1 to 19 carbon atoms, a hydroxyl group or a group represented by a formula "AgO—";

each X independently represents a hydrogen atom, an aliphatic hydrocarbon group of 1 to 20 carbon atoms, a halogen atom, a phenyl group or benzyl group in which one or more hydrogen atoms may be substituted with a substituent, a cyano group, an N-phthaloyl-3-amino-propyl group, a 2-ethoxyvinyl group or a group represented by a general formula "$R^7O$—", "$R^7S$—", "$R^7$—C(=O)—" or "$R^7$—C(=O)—O—"; and $R^7$ represents an aliphatic hydrocarbon group of 1 to 10 carbon atoms, a thienyl group, or a phenyl group or diphenyl group in which one or more hydrogen atoms may be substituted with a substituent)

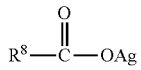

(4)

(In the formula, $R^8$ represents an aliphatic hydrocarbon group of 1 to 19 carbon atoms, a carboxy group or a group represented by a formula "—COOAg", and when the aforementioned aliphatic hydrocarbon group has a methylene group, one or more of the methylene group may be substituted with a carbonyl group.)

In the silver ink composition of the present invention, the aforementioned silver carboxylate is preferably at least one member selected from the group consisting of silver 2-methylacetoacetate, silver acetoacetate, silver 2-ethylacetoacetate, silver propionylacetate, silver isobutyrylacetate, silver pivaloylacetate, silver caproylacetate, silver 2-n-butylacetoacetate, silver 2-benzylacetoacetate, silver benzoylacetate, silver pivaloylacetoacetate, silver isobutyrylacetoacetate, silver acetonedicarboxylate, silver pyruvate, silver acetate, silver butyrate, silver isobutyrate, silver 2-ethylhexanoate, silver neodecanoate, silver oxalate and silver malonate.

In the silver ink composition of the present invention, the aforementioned reducing compound is preferably at least one member selected from the group consisting of formic acid, methyl formate, ethyl formate, butyl formate, propanal, butanal, hexanal, formamide, N,N-dimethylformamide and oxalic acid.

In addition, the present invention provides a conductor characterized by being obtained by forming metallic silver using the aforementioned silver ink composition.

Further, the present invention provides a communication device characterized by having a conductor obtained by forming metallic silver on a substrate using the aforementioned silver ink composition, and further having the aforementioned substrate as a housing.

In addition, in order to solve the above problems, the present invention provides a silver ink composition characterized by being formed by preparing a second mixture by supplying carbon dioxide to a first mixture formed by mixing a silver carboxylate having a group represented by a formula "—COOAg" and one or more nitrogen-containing compounds selected from the group consisting of amine compounds and quaternary ammonium salts of not more than 25 carbon atoms, ammonia, and ammonium salts obtained by reacting the aforementioned amine compounds or ammonia with an acid; and further mixing one or more reducing compounds selected from the group consisting of oxalic acid, hydrazine and compounds represented by a general formula (5) shown below to the aforementioned second mixture:

(5)

(in the formula, $R^{21}$ represents an alkyl group, alkoxy group or N,N-dialkylamino group of not more than 20 carbon atoms, a hydroxyl group or an amino group.)

In the silver ink composition of the present invention, it is preferable that the aforementioned silver carboxylate be at least one member selected from the group consisting of silver β-ketocarboxylates represented by a general formula (1) shown below and silver carboxylates represented by a general formula (4) shown below.

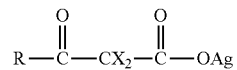

(1)

(In the formula, R represents an aliphatic hydrocarbon group or phenyl group of 1 to 20 carbon atoms in which one or more hydrogen atoms may be substituted with a substituent, a hydroxyl group, an amino group or a group represented by a general formula "$R^1$—$CY_2$—","$CY_3$—", "$R^1$—CHY—", "$R^2O$—", "$R^5R^4N$—", "$(R^3O)_2CY$—" or "$R^6$—C(=O)—$CY_2$—";

each Y independently represents a fluorine atom, a chlorine atom, a bromine atom or a hydrogen atom; $R^1$ represents an aliphatic hydrocarbon group of 1 to 19 carbon atoms or a phenyl group; $R^2$ represents an aliphatic hydrocarbon group of 1 to 20 carbon atoms; $R^3$ represents an aliphatic hydrocarbon group of 1 to 16 carbon atoms; each of $R^4$ and $R^5$ independently represents an aliphatic hydrocarbon group of 1 to 18 carbon atoms; and $R^6$ represents an aliphatic hydrocarbon group of 1 to 19 carbon atoms, a hydroxyl group or a group represented by a formula "AgO—";

each X independently represents a hydrogen atom, an aliphatic hydrocarbon group of 1 to 20 carbon atoms, a halogen atom, a phenyl group or benzyl group in which one or more hydrogen atoms may be substituted with a substituent, a cyano group, an N-phthaloyl-3-amino-propyl group, a 2-ethoxyvinyl group or a group represented by a general formula "$R^7O$—", "$R^7S$—", "$R^7$—C(=O)—" or "$R^7$—C(=O)—O—"; and $R^7$ represents an aliphatic hydrocarbon group of 1 to 10 carbon atoms, a thienyl group, or a phenyl group or diphenyl group in which one or more hydrogen atoms may be substituted with a substituent)

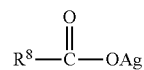

(4)

(In the formula, $R^8$ represents an aliphatic hydrocarbon group of 1 to 19 carbon atoms, a carboxy group or a group represented by a formula "—COOAg", and when the aforementioned aliphatic hydrocarbon group has a methylene group, one or more of the methylene group may be substituted with a carbonyl group.)

In the silver ink composition of the present invention, the aforementioned silver carboxylate is preferably at least one member selected from the group consisting of silver 2-methylacetoacetate, silver acetoacetate, silver 2-ethylacetoacetate, silver propionylacetate, silver isobutyrylacetate, silver pivaloylacetate, silver 2-n-butylacetoacetate, silver 2-benzylacetoacetate, silver benzoylacetate, silver pivaloylacetoacetate, silver isobutyrylacetoacetate, silver acetonedicarboxylate, silver pyruvate, silver acetate, silver butyrate, silver isobutyrate, silver 2-ethylhexanoate, silver neodecanoate, silver oxalate and silver malonate.

In the silver ink composition of the present invention, the aforementioned reducing compound is preferably at least one member selected from the group consisting of formic acid, methyl formate, ethyl formate, butyl formate, propanal, butanal, hexanal, formamide, N,N-dimethylformamide and oxalic acid.

In the silver ink composition of the present invention, the aforementioned first mixture may be one formed by further mixing acetylene alcohols represented by a general formula (2) shown below.

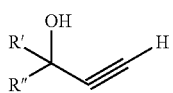

(2)

(In the formula, each of R' and R" independently represents an alkyl group of 1 to 20 carbon atoms, or a phenyl group in which one or more hydrogen atoms may be substituted with a substituent.)

In addition, the present invention provides a conductor characterized by being obtained by forming metallic silver using the aforementioned silver ink composition.

Further, the present invention provides a communication device characterized by having a conductor obtained by forming metallic silver on a substrate using the aforementioned silver ink composition, and further having the aforementioned substrate as a housing.

Effects of Invention

According to the present invention, a silver ink composition capable of forming metallic silver having sufficient electrical conductivity without carrying out a heat treatment at high temperatures; and a conductor and communication device which are obtained by using this silver ink composition are provided.

BEST MODE FOR CARRYING OUT THE INVENTION (First Embodiment)
<Silver Ink Composition>

A silver ink composition according to the present invention is characterized by being formed by mixing: a silver carboxylate having a group represented by a formula "—COOAg" (hereinafter, may be simply abbreviated as "silver carboxylate"); one or more nitrogen-containing compounds selected from the group consisting of amine compounds and quaternary ammonium salts of not more than 25 carbon atoms, ammonia, and ammonium salts obtained by reacting the aforementioned amine compounds or ammonia with an acid (hereinafter, may be simply abbreviated as "nitrogen-containing compound"); and one or more reducing compounds (hereinafter, may be simply abbreviated as "reducing compound") selected from the group consisting of oxalic acid, hydrazine and compounds represented by a general formula (5) shown below (hereinafter, may be abbreviated as "compound (5)"):

(5)

(in the formula, $R^{21}$ represents an alkyl group, alkoxy group or N,N-dialkylamino group of not more than 20 carbon atoms, a hydroxyl group or an amino group.)

By mixing the aforementioned reducing compound, the above silver ink composition can form metallic silver more easily, and, for example, can form metallic silver (conductor) having sufficient electrical conductivity even by a heat treatment at a low temperature.

[Silver Carboxylate]

The above silver carboxylate is not particularly limited as long as it has a group represented by the formula "—COOAg". For example, the number of groups represented by the formula "—COOAg" may be only one, or may be two or more. In addition, the position of the group represented by the formula "—COOAg" in silver carboxylate is also not particularly limited.

In the present invention, one type of the aforementioned silver carboxylate may be used alone or two or more types thereof may be used in combination. When two or more types are used in combination, their combination and ratio can be adjusted arbitrarily.

It is preferable that the aforementioned silver carboxylate be at least one member selected from the group consisting of silver β-ketocarboxylates represented by a general formula (1) shown below (hereinafter, may be abbreviated as "silver β-ketocarboxylate (1)") and silver carboxylates represented by a general formula (4) shown below (hereinafter, may be abbreviated as "silver carboxylate (4)").

It should be noted that in the present specification, unless otherwise specified, a simple description of "silver carboxylate" refers not only to "silver β-ketocarboxylate (1)" and "silver carboxylate (4)", but means "silver carboxylate having a group represented by the formula "—COOAg" that includes these.

(1)

(In the formula, R represents an aliphatic hydrocarbon group or phenyl group of 1 to 20 carbon atoms in which one or more hydrogen atoms may be substituted with a substituent, a hydroxyl group, an amino group or a group represented by a general formula "$R^1$—$CY_2$—", "$CY_3$—", "$R^1$—CHY—", "$R^2O$—", "$R^5R^4N$—", "$(R^3O)_2CY$—" or "$R^6$—C(=O)—$CY_2$—";

each Y independently represents a fluorine atom, a chlorine atom, a bromine atom or a hydrogen atom; $R^1$ represents an aliphatic hydrocarbon group of 1 to 19 carbon atoms or a phenyl group; $R^2$ represents an aliphatic hydrocarbon group of 1 to 20 carbon atoms; $R^3$ represents an aliphatic hydrocarbon group of 1 to 16 carbon atoms; each of $R^4$ and $R^5$ independently represents an aliphatic hydrocarbon group of 1 to 18 carbon atoms; and $R^6$ represents an aliphatic hydrocarbon group of 1 to 19 carbon atoms, a hydroxyl group or a group represented by a formula "AgO—";

each X independently represents a hydrogen atom, an aliphatic hydrocarbon group of 1 to 20 carbon atoms, a halogen atom, a phenyl group or benzyl group in which one or more hydrogen atoms may be substituted with a substituent, a cyano group, an N-phthaloyl-3-amino-propyl group, a 2-ethoxyvinyl group or a group represented by a general formula "R$^7$O—", "R$^7$S—", "R$^7$—C(═O)—" or "R$^7$—C(═O)—O—"; and R$^7$ represents an aliphatic hydrocarbon group of 1 to 10 carbon atoms, a thienyl group, or a phenyl group or diphenyl group in which one or more hydrogen atoms may be substituted with a substituent)

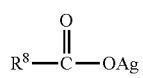

(4)

(In the formula, R$^8$ represents an aliphatic hydrocarbon group of 1 to 19 carbon atoms, a carboxy group or a group represented by a formula "—COOAg", and when the aforementioned aliphatic hydrocarbon group has a methylene group, one or more of the methylene group may be substituted with a carbonyl group.)

(Silver β-ketocarboxylate (1))

A silver β-ketocarboxylate (1) is represented by the above general formula (1).

In the formula, R represents an aliphatic hydrocarbon group or phenyl group of 1 to 20 carbon atoms in which one or more hydrogen atoms may be substituted with a substituent, a hydroxyl group, an amino group or a group represented by a general formula "R$^1$—CY$_2$—", "CY$_3$—", "R$^1$—CHY—", "R$^2$O—", "R$^5$R$^4$N—", "(R$^3$O)$_2$CY—" or "R$^6$—C(═O)—CY$_2$—".

The aliphatic hydrocarbon group of 1 to 20 carbon atoms represented by R may be any one of linear, branched and cyclic groups (aliphatic cyclic groups), and may be either a monocyclic group or a polycyclic group when it is a cyclic group. In addition, the above aliphatic hydrocarbon group may be either a saturated aliphatic hydrocarbon group or an unsaturated aliphatic hydrocarbon group. Moreover, the above aliphatic hydrocarbon group preferably has 1 to 10 carbon atoms, and more preferably has 1 to 6 carbon atoms. Preferred examples of the above aliphatic hydrocarbon group represented by R include an alkyl group, an alkenyl group and an alkynyl group.

As the above linear or branched alkyl group represented by R, a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, a 2-methylbutyl group, an n-hexyl group, a 1-methylpentyl group, a 2-methylpentyl group, a 3-methylpentyl group, a 4-methylpentyl group, a 1,1-dimethylbutyl group, a 2,2-dimethylbutyl group, a 3,3-dimethylbutyl group, a 2,3-dimethylbutyl group, a 1-ethylbutyl group, a 2-ethylbutyl group, a 3-ethylbutyl group, a 1-ethyl-1-methylpropyl group, an n-heptyl group, a 1-methylhexyl group, a 2-methylhexyl group, a 3-methylhexyl group, a 4-methylhexyl group, a 5-methylhexyl group, a 1,1-dimethylpentyl group, a 2,2-dimethylpentyl group, a 2,3-dimethylpentyl group, a 2,4-dimethylpentyl group, a 3,3-dimethylpentyl group, a 4,4-dimethylpentyl group, a 1-ethylpentyl group, a 2-ethylpentyl group, a 3-ethylpentyl group, a 4-ethylpentyl group, a 2,2,3-trimethylbutyl group, a 1-propylbutyl group, an n-octyl group, an isooctyl group, a 1-methylheptyl group, a 2-methylheptyl group, a 3-methylheptyl group, a 4-methylheptyl group, a 5-methylheptyl group, a 1-ethylhexyl group, a 2-ethylhexyl group, a 3-ethylhexyl group, a 4-ethylhexyl group, a 5-ethylhexyl group, a 1,1-dimethylhexyl group, a 2,2-dimethylhexyl group, a 3,3-dimethylhexyl group, a 4,4-dimethylhexyl group, a 5,5-dimethylhexyl group, a 1-propylpentyl group, a 2-propylpentyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an icosyl group can be exemplified.

Examples of the above cyclic alkyl group represented by R include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, 2-adamantyl group and a tricyclodecyl group.

As the above alkenyl group represented by R, groups in which one of the single bonds (C—C) between the carbon atoms in the above alkyl groups represented by R is substituted with a double bond (C═C), such as a vinyl group (ethenyl group, —CH═CH$_2$), an allyl group (2-propenyl group, —CH$_2$—CH═CH$_2$), a 1-propenyl group (—CH═CH—CH$_3$), an isopropenyl group (—C(CH$_3$)═CH$_2$), a 1-butenyl group (—CH═CH—CH$_2$—CH$_3$), a 2-butenyl group (—CH$_2$—CH═CH—CH$_3$), a 3-butenyl group (—CH$_2$—CH$_2$—CH═CH$_2$), a cyclohexenyl group and a cyclopentenyl group, can be exemplified.

As the above alkynyl group represented by R, groups in which one of the single bonds (C—C) between the carbon atoms in the above alkyl groups represented by R is substituted with a triple bond (C≡C), such as an ethynyl group (—C≡CH) and a propargyl group (—CH$_2$—C≡CH), can be exemplified.

In the aliphatic hydrocarbon group of 1 to 20 carbon atoms represented by R, one or more hydrogen atoms may be substituted with a substituent, and preferred examples of the above substituent include a fluorine atom, a chlorine atom and a bromine atom. In addition, the number and position of the substituent are not particularly limited. Further, when the number of the substituent is two or more, these plurality of substituents may be the same or different from each other. That is, all the substituents may be the same, all the substituents may be different, or only some of the substituents may be different.

In the phenyl group represented by R, one or more hydrogen atoms may be substituted with a substituent, and preferred examples of the above substituent include a saturated or unsaturated monovalent aliphatic hydrocarbon group of 1 to 16 carbon atoms, a monovalent group formed by the aliphatic hydrocarbon group being bonded to an oxygen atom, a fluorine atom, a chlorine atom, a bromine atom, a hydroxyl group (—OH), a cyano group (—CN) and a phenoxy group (—O—C$_6$H$_5$), while the number and position of the substituent are not particularly limited. Further, when the number of the substituent is two or more, these plurality of substituents may be the same or different from each other.

Examples of the above aliphatic hydrocarbon group as a substituent include the same aliphatic hydrocarbon groups as those described above for R with the exception that the number of carbon atoms is from 1 to 16.

Each Y in R independently represents a fluorine atom, a chlorine atom, a bromine atom or a hydrogen atom. Further, a plurality of Y in the general formulas "R$^1$—CY$_2$—", "CY$_3$—" and "R$^6$—C(═O)—CY$_2$—" may be the same or different from each other.

$R^1$ in R represents an aliphatic hydrocarbon group of 1 to 19 carbon atoms or a phenyl group ($C_6H_5$—), and as the above aliphatic hydrocarbon group represented by $R^1$, the same aliphatic hydrocarbon groups as those described above for R can be exemplified with the exception that the number of carbon atoms is from 1 to 19.

$R^2$ in R represents an aliphatic hydrocarbon group of 1 to 20 carbon atoms, and the same aliphatic hydrocarbon groups as those described above for R can be exemplified.

$R^3$ in R represents an aliphatic hydrocarbon group of 1 to 16 carbon atoms, and the same aliphatic hydrocarbon groups as those described above for R can be exemplified with the exception that the number of carbon atoms is from 1 to 16.

Each of $R^4$ and $R^5$ in R independently represents an aliphatic hydrocarbon group of 1 to 18 carbon atoms. That is, $R^4$ and $R^5$ may be the same or different from each other, and the same aliphatic hydrocarbon groups as those described above for R can be exemplified with the exception that the number of carbon atoms is from 1 to 18.

$R^6$ in R represents an aliphatic hydrocarbon group of 1 to 19 carbon atoms, a hydroxyl group or a group represented by a formula "AgO—", and as the above aliphatic hydrocarbon group represented by $R^6$, the same aliphatic hydrocarbon groups as those described above for R can be exemplified with the exception that the number of carbon atoms is from 1 to 19.

Among these described above, R is preferably a linear or branched alkyl group, a group represented by a general formula "$R^6$—C(=O)—$CY_2$—", a hydroxyl group or a phenyl group. Further, $R^6$ is preferably a linear or branched alkyl group, a hydroxyl group or a group represented by a formula "AgO—".

In the general formula (1), each X independently represents a hydrogen atom, an aliphatic hydrocarbon group of 1 to 20 carbon atoms, a halogen atom, a phenyl group or benzyl group ($C_6H_5$—$CH_2$—) in which one or more hydrogen atoms may be substituted with a substituent, a cyano group, an N-phthaloyl-3-amino-propyl group, a 2-ethoxyvinyl group ($C_2H_5$—O—CH=CH—) or a group represented by a general formula "$R^7$O—", "$R^7$S—", "$R^7$—C(=O)—" or "$R^7$—C(=O)—O—".

As the aliphatic hydrocarbon group of 1 to 20 carbon atoms represented by X, the same aliphatic hydrocarbon groups as those described above for R can be exemplified.

Examples of the halogen atom represented by X include a fluorine atom, a chlorine atom, a bromine atom and an iodine atom.

In the phenyl group and benzyl group represented by X, one or more hydrogen atoms may be substituted with a substituent, and preferred examples of the above substituent include a halogen atom (a fluorine atom, a chlorine atom, a bromine atom and an iodine atom) and a nitro group (—$NO_2$), while the number and position of the substituent are not particularly limited. Further, when the number of the substituent is two or more, these plurality of substituents may be the same or different from each other.

$R^7$ in X represents an aliphatic hydrocarbon group of 1 to 10 carbon atoms, a thienyl group ($C_4H_3S$—), or a phenyl group or diphenyl group (biphenyl group, $C_6H_5$—$C_6H_4$—) in which one or more hydrogen atoms may be substituted with a substituent. Examples of the above aliphatic hydrocarbon group represented by $R^7$ include the same aliphatic hydrocarbon groups as those described above for R with the exception that the number of carbon atoms is from 1 to 10. In addition, as the above substituent of the phenyl group and diphenyl group represented by $R^7$, a halogen atom (a fluorine atom, a chlorine atom, a bromine atom and an iodine atom) and the like can be exemplified, while the number and position of the substituent are not particularly limited. Further, when the number of the substituent is two or more, these plurality of substituents may be the same or different from each other.

When $R^7$ is a thienyl group or a diphenyl group, the bonding position of these with an adjacent group or atom (an oxygen atom, a sulfur atom, a carbonyl group or a carbonyloxy group) in X is not particularly limited. For example, the thienyl group may be either a 2-thienyl group or a 3-thienyl group.

In the general formula (1), the two X may be bonded with the carbon atom sandwiched between two carbonyl groups as one group via a double bond, and examples thereof include a group represented by a formula "=CH—$C_6H_4$—$NO_2$".

Among these described above, X is preferably a hydrogen atom, a linear or branched alkyl group, a benzyl group or a group represented by a general formula "$R^7$—C(=O)—", and at least one of X is preferably a hydrogen atom.

The silver β-ketocarboxylate (1) is preferably silver 2-methylacetoacetate ($CH_3$—C(=O)—CH($CH_3$)—C(=O)—OAg), silver acetoacetate ($CH_3$—C(=O)—$CH_2$—C(=O)—OAg), silver 2-ethylacetoacetate ($CH_3$—C(=O)—CH($CH_2CH_3$)—C(=O)—OAg), silver propionylacetate ($CH_3CH_2$—C(=O)—$CH_2$—C(=O)—OAg), silver isobutyrylacetate (($CH_3$)$_2$CH—C(=O)—$CH_2$—C(=O)—OAg), silver pivaloylacetate (($CH_3$)$_3$C—C(=O)—$CH_2$—C(=O)—OAg), silver caproylacetate ($CH_3$($CH_2$)$_3$$CH_2$—C(=O)—$CH_2$—C(=O)—OAg), silver 2-n-butylacetoacetate ($CH_3$—C(=O)—CH($CH_2CH_2CH_2CH_3$)—C(=O)—OAg), silver 2-benzylacetoacetate ($CH_3$—C(=O)—CH($CH_2C_6H_5$)—C(=O)—OAg), silver benzoylacetate ($C_6H_5$—C(=O)—$CH_2$—C(=O)—OAg), silver pivaloylacetoacetate (($CH_3$)$_3$C—C(=O)—$CH_2$—C(=O)—$CH_2$—C(=O)—OAg), silver isobutyrylacetoacetate (($CH_3$)$_2$CH—C(=O)—$CH_2$—C(=O)—$CH_2$—C(=O)—OAg), silver 2-acetyl pivaloyl acetate (($CH_3$)$_3$C—C(=O)—CH(—C(=O)—$CH_3$)—C(=O)—OAg), silver 2-acetyl isobutyrylacetate (($CH_3$)$_2$CH—C(=O)—CH(—C(=O)—$CH_3$)—C(=O)—OAg) or silver acetonedicarboxylate (AgO—C(=O)—$CH_2$—C(=O)—$CH_2$—C(=O)—OAg).

The silver β-ketocarboxylate (1) is capable of further reducing the concentration of the raw materials and impurities that are remaining in a conductor (metallic silver) formed by a post-treatment such as a drying treatment and heating (baking) treatment. As the raw materials or impurities reduce, for example, the contact between the formed metallic silver becomes favorable, the conduction is facilitated and the resistivity decreases.

As described later, the silver β-ketocarboxylate (1) can be decomposed at a low temperature, preferably from 60 to 210° C. and more preferably from 60 to 200° C., and can form metallic silver without using the reducing agents and the like that are known in the art. Further, it is decomposed at even lower temperatures to form metallic silver by being used in combination with a reducing agent such as the aforementioned reducing compound.

In the present invention, one type of the silver β-ketocarboxylate (1) may be used alone or two or more types thereof may be used in combination. When two or more types are used in combination, their combination and ratio can be adjusted arbitrarily.

(Silver Carboxylate (4))

A silver carboxylate (4) is represented by the above general formula (4).

In the formula, $R^8$ represents an aliphatic hydrocarbon group of 1 to 19 carbon atoms, a carboxy group (—COOH) or a group represented by a formula "—COOAg".

Examples of the above aliphatic hydrocarbon group represented by $R^8$ include the same aliphatic hydrocarbon groups as those described above for R with the exception that the number of carbon atoms is from 1 to 19. However, the above aliphatic hydrocarbon group represented by $R^8$ preferably has 1 to 15 carbon atoms, and more preferably has 1 to 10 carbon atoms.

When the aforementioned aliphatic hydrocarbon group represented by $R^8$ has a methylene group (—$CH_2$—), one or more of the methylene group may be substituted with a carbonyl group. The number and position of the methylene group which may be substituted with a carbonyl group are not particularly limited, and all the methylene groups may be substituted with carbonyl groups. Here, the term "methylene group" refers not only to the group represented by a single formula "—$CH_2$—", but also includes a group represented by one of the formulas "—$CH_2$—" in the alkylene groups in which a plurality of the groups represented by the formula "—$CH_2$—" are linked in series.

The silver carboxylate (4) is preferably silver pyruvate ($CH_3$—C(=O)—C(=O)—OAg), silver acetate ($CH_3$—C(=O)—OAg), silver butyrate ($CH_3$—($CH_2$)$_2$—C(=O)—OAg), silver isobutyrate (($CH_3$)$_2$CH—C(=O)—OAg), silver 2-ethylhexanoate ($CH_3$—($CH_2$)$_3$—CH($CH_2CH_3$)—C(=O)—OAg), silver neodecanoate ($CH_3$—($CH_2$)$_5$—C($CH_3$)$_2$—C(=O)—OAg), silver oxalate (AgO—C(=O)—C(=O)—OAg) or silver malonate (AgO—C(=O)—$CH_2$—C(=O)—OAg). In addition, those obtained by replacing one of the two groups represented by the formula "—COOAg" in silver oxalate (AgO—C(=O)—C(=O)—OAg) and silver malonate (AgO—C(=O)—$CH_2$—C(=O)—OAg) described above with a group represented by the formula "—COOH" (HO—C(=O)—C(=O)—OAg, HO—C(=O)—$CH_2$—C(=O)—OAg) are also preferred.

The silver carboxylate (4) is also capable of further reducing the concentration of the raw materials and impurities that are remaining in a conductor (metallic silver) formed by a post-treatment such as a drying treatment and heating (baking) treatment, just like the silver β-ketocarboxylate (1). Further, it is decomposed at even lower temperatures to form metallic silver by being used in combination with a reducing agent such as the aforementioned reducing compound.

In the present invention, one type of the silver carboxylate (4) may be used alone or two or more types thereof may be used in combination. When two or more types are used in combination, their combination and ratio can be adjusted arbitrarily.

The above silver carboxylate is preferably at least one member selected from the group consisting of silver 2-methylacetoacetate, silver acetoacetate, silver 2-ethylacetoacetate, silver propionylacetate, silver isobutyrylacetate, silver pivaloylacetate, silver caproylacetate, silver 2-n-butylacetoacetate, silver 2-benzylacetoacetate, silver benzoylacetate, silver pivaloylacetoacetate, silver isobutyrylacetoacetate, silver acetonedicarboxylate, silver pyruvate, silver acetate, silver butyrate, silver isobutyrate, silver 2-ethylhexanoate, silver neodecanoate, silver oxalate and silver malonate.

Further, among these silver carboxylates, silver 2-methylacetoacetate and silver acetoacetate can be mentioned as exhibiting excellent compatibility with the nitrogen-containing compounds (particularly amine compounds) described later and being particularly suitable for increasing the concentration of the silver ink composition.

[Nitrogen-Containing Compound]

The aforementioned nitrogen-containing compound is at least one member selected from the group consisting of amine compounds of not more than 25 carbon atoms (hereinafter, may be abbreviated as an "amine compound"), quaternary ammonium salts of not more than 25 carbon atoms (hereinafter, may be abbreviated as a "quaternary ammonium salt"), ammonia, ammonium salts formed by reacting the amine compounds of not more than 25 carbon atoms with an acid (hereinafter, may be abbreviated as an "ammonium salt derived from amine compounds") and ammonium salts formed by reacting ammonia with an acid (hereinafter, may be abbreviated as an "ammonium salt derived from ammonia"). That is, the nitrogen-containing compound to be mixed may be composed only of one type or may be composed of two or more types, and when two or more types are used in combination, their combination and ratio can be adjusted arbitrarily.

(Amine Compounds, Quaternary Ammonium Salts)

In the present invention, the aforementioned amine compound has 1 to 25 carbon atoms and may be any one of a primary amine, a secondary amine and a tertiary amine. In addition, the aforementioned quaternary ammonium salt has 4 to 25 carbon atoms. The aforementioned amine compound and quaternary ammonium salt may be either chain-like or cyclic. In addition, the number of the nitrogen atoms that constitute the amine moiety or ammonium salt moiety (for example, nitrogen atoms constituting the amino group (—$NH_2$) of a primary amine) may be one, or may be two or more.

As the above primary amine, monoalkyl amines, monoaryl amines, mono(heteroaryl) amines, diamines and the like in which one or more hydrogen atoms may be substituted with a substituent can be exemplified.

The alkyl group constituting the above monoalkyl amines may be any one of linear, branched, and cyclic groups, the same alkyl groups as those described above for R can be exemplified, and is preferably a linear or branched alkyl group of 1 to 19 carbon atoms or a cyclic alkyl group of 3 to 7 carbon atoms.

Specific examples of the preferred monoalkyl amines described above include n-butylamine, n-hexylamine, n-octylamine, n-dodecylamine, n-octadecylamine, sec-butylamine, tert-butylamine, 3-aminopentane, 3-methylbutylamine, 2-heptylamine(2-aminoheptane), 2-aminooctane, 2-ethylhexylamine and 1,2-dimethyl-n-propylamine.

The aryl group constituting the aforementioned monoaryl amines preferably has 6 to 10 carbon atoms, and examples thereof include a phenyl group, a 1-naphthyl group and a 2-naphthyl group.

The heteroaryl group constituting the aforementioned mono(heteroaryl) amines is one having a hetero atom as an atom constituting the aromatic ring skeleton, and examples of the above hetero atom include a nitrogen atom, a sulfur atom, an oxygen atom and a boron atom. In addition, the number of the above hetero atoms that constitute the aromatic ring skeleton is not particularly limited, and may be one or may be two or more. If it is two or more, these hetero atoms may be the same or different from each other. That is, all of these hetero atoms may be the same, all of these may be different, or only some of these may be different.

The aforementioned heteroaryl group may be either monocyclic or polycyclic, and the number of the ring members thereof (the number of atoms constituting the ring skeleton) is also not particularly limited, although it is preferably a 3 to 12-membered ring.

As the above heteroaryl group that is a monocyclic group having 1 to 4 nitrogen atoms, a pyrrolyl group, a pyrrolinyl group, an imidazolyl group, a pyrazolyl group, a pyridyl group, a pyrimidyl group, a pyrazinyl group, a pyridazinyl group, a triazolyl group, a tetrazolyl group, a pyrrolidinyl group, an imidazolidinyl group, a piperidinyl group, a pyrazolidinyl group and a piperazinyl group can be exemplified, and 3 to 8-membered rings are preferred, and 5 to 6-membered rings are more preferred.

As the above heteroaryl group that is a monocyclic group having one oxygen atom, a furanyl group can be exemplified, and 3 to 8-membered rings are preferred, and 5 to 6-membered rings are more preferred.

As the above heteroaryl group that is a monocyclic group having one sulfur atom, a thienyl group can be exemplified, and 3 to 8-membered rings are preferred, and 5 to 6-membered rings are more preferred.

As the above heteroaryl group that is a monocyclic group having 1 to 2 oxygen atoms and 1 to 3 nitrogen atoms, an oxazolyl group, an isoxazolyl group, an oxadiazolyl group and a morpholinyl group can be exemplified, and 3 to 8-membered rings are preferred, and 5 to 6-membered rings are more preferred.

As the above heteroaryl group that is a monocyclic group having 1 to 2 sulfur atoms and 1 to 3 nitrogen atoms, a thiazolyl group, a thiadiazolyl group and a thiazolidinyl group can be exemplified, and 3 to 8-membered rings are preferred, and 5 to 6-membered rings are more preferred.

As the above heteroaryl group that is a polycyclic group having 1 to 5 nitrogen atoms, an indolyl group, an isoindolyl group, an indolizinyl group, a benzimidazolyl group, a quinolyl group, an isoquinolyl group, an indazolyl group, a benzotriazolyl group, a tetrazolopyridyl group, a tetrazolopyridazinyl group and a dihydrotriazolopyridazinyl group can be exemplified, and 7 to 12-membered rings are preferred, and 9 to 10-membered rings are more preferred.

As the above heteroaryl group that is a polycyclic group having 1 to 3 sulfur atoms, a dithianaphthalenyl group and a benzothiophenyl group can be exemplified, and 7 to 12-membered rings are preferred, and 9 to 10-membered rings are more preferred.

As the above heteroaryl group that is a polycyclic group having 1 to 2 oxygen atoms and 1 to 3 nitrogen atoms, a benzoxazolyl group and a benzoxadiazolyl group can be exemplified, and 7 to 12-membered rings are preferred, and 9 to 10-membered rings are more preferred.

As the above heteroaryl group that is a polycyclic group having 1 to 2 sulfur atoms and 1 to 3 nitrogen atoms, a benzothiazolyl group and a benzothiadiazolyl group can be exemplified, and 7 to 12-membered rings are preferred, and 9 to 10-membered rings are more preferred.

As long as the above diamine has two amino groups, the positional relationship between the two amino groups is not particularly limited. Preferred examples of the above diamine include the aforementioned monoalkyl amines, monoaryl amines or mono(heteroaryl) amines in which one of the hydrogen atoms other than the hydrogen atoms constituting the amino group (—NH2) is substituted with an amino group.

The above diamine preferably has 1 to 10 carbon atoms, and more preferred examples thereof include ethylenediamine, 1,3-diaminopropane and 1,4-diaminobutane.

As the above secondary amine, dialkyl amines, diaryl amines, di(heteroaryl) amines and the like in which one or more hydrogen atoms may be substituted with a substituent can be exemplified.

The alkyl group constituting the above dialkyl amines is the same as the alkyl groups constituting the above monoalkyl amines, and a linear or branched alkyl group of 1 to 9 carbon atoms or a cyclic alkyl group of 3 to 7 carbon atoms is preferred. In addition, two alkyl groups in one molecule of the dialkyl amine may be the same or different from each other.

Specific examples of the preferred dialkyl amines described above include N-methyl-n-hexylamine, diisobutylamine and di(2-ethylhexyl)amine.

The aryl group constituting the aforementioned diaryl amines is the same as the aryl groups constituting the above monoaryl amines, and preferably has 6 to 10 carbon atoms. In addition, two aryl groups in one molecule of the diaryl amine may be the same or different from each other.

The heteroaryl group constituting the above di(heteroaryl) amines is the same as the heteroaryl groups constituting the aforementioned mono(heteroaryl) amines, and is preferably a 6 to 12-membered ring. In addition, two heteroaryl groups in one molecule of the di(heteroaryl) amine may be the same or different from each other.

As the above tertiary amine, trialkyl amines, dialkyl monoaryl amines and the like in which one or more hydrogen atoms may be substituted with a substituent can be exemplified.

The alkyl group constituting the above trialkyl amines is the same as the alkyl groups constituting the above monoalkyl amines, and a linear or branched alkyl group of 1 to 19 carbon atoms or a cyclic alkyl group of 3 to 7 carbon atoms is preferred. In addition, three alkyl groups in one molecule of the trialkyl amine may be the same or different from each other. In other words, all three alkyl groups may be the same, all of these may be different, or only some of these may be different.

Specific examples of the preferred trialkyl amines described above include N,N-dimethyl-n-octadecylamine and N,N-dimethylcyclohexylamine.

The alkyl group constituting the above dialkyl monoaryl amines is the same as the alkyl groups constituting the above monoalkyl amines, and a linear or branched alkyl group of 1 to 6 carbon atoms or a cyclic alkyl group of 3 to 7 carbon atoms is preferred. In addition, two alkyl groups in one molecule of the dialkyl monoaryl amine may be the same or different from each other.

The aryl group constituting the aforementioned dialkyl monoaryl amines is the same as the aryl groups constituting the above monoaryl amines, and preferably has 6 to 10 carbon atoms.

In the present invention, as the above quaternary ammonium salts, tetraalkylammonium halides and the like in which one or more hydrogen atoms may be substituted with a substituent can be exemplified.

The alkyl group constituting the above tetraalkylammonium halides is the same as the alkyl groups constituting the above monoalkyl amines, and preferably has 1 to 19 carbon atoms.

In addition, four alkyl groups in one molecule of the tetraalkylammonium halide may be the same or different from each other. In other words, all four alkyl groups may be the same, all of these may be different, or only some of these may be different.

As the halogen constituting the above tetraalkylammonium halides, fluorine, chlorine, bromine and iodine can be exemplified.

Specific examples of the preferred tetraalkylammonium halides described above include dodecyltrimethylammonium bromide.

Although the chain-like amine compounds and quaternary organic ammonium salts have been mainly described so far, the above amine compounds and quaternary ammonium salts may be a heterocyclic compound in which the nitrogen atom constituting the amine moiety or ammonium salt moiety is a part of a ring skeleton structure (heterocyclic skeleton structure). That is, the above amine compound may be a cyclic amine, and the above quaternary ammonium salt may be a cyclic ammonium salt. The structure of the ring (ring containing the nitrogen atom constituting the amine moiety or ammonium salt moiety) in this case may be either monocyclic or polycyclic, and the number of ring members (the number of atoms constituting the ring skeleton) is also not particularly limited and may be either an aliphatic ring or an aromatic ring.

In the case of a cyclic amine, preferred examples include pyridine.

With respect to the primary amines, secondary amines, tertiary amines and quaternary ammonium salts described above, the "hydrogen atom which may be substituted with a substituent" is a hydrogen atom other than the hydrogen atom bonded to the nitrogen atom constituting the amine moiety or ammonium salt moiety. The number of the substituents at this time is not particularly limited, and may be one or may be two or more, and all of the above hydrogen atoms may be substituted with a substituent. When the number of the substituent is two or more, these plurality of substituents may be the same or different from each other. That is, all of the plurality of substituents may be the same, all of these may be different, or only some of these may be different. In addition, the position of the substituents is also not particularly limited.

Examples of the above substituent in the aforementioned amine compounds and quaternary ammonium salts include an alkyl group, an aryl group, a halogen atom, a cyano group, a nitro group, a hydroxyl group and a trifluoromethyl group ($-CF_3$). Here, examples of the halogen atom include a fluorine atom, a chlorine atom, a bromine atom and an iodine atom.

When the alkyl group constituting the above monoalkyl amine has a substituent, such an alkyl group is preferably a linear or branched alkyl group of 1 to 9 carbon atoms having an aryl group as a substituent, or a cyclic alkyl group of 3 to 7 carbon atoms preferably having an alkyl group of 1 to 5 carbon atoms as a substituent, and specific examples of the monoalkyl amines having such substituents include 2-phenylethylamine, benzylamine and 2,3-dimethylcyclohexylamine.

In addition, in the above aryl group and alkyl group serving as a substituent, one or more hydrogen atoms may be further substituted with a halogen atom, and examples of such monoalkyl amines having a substituent substituted with a halogen atom include 2-bromobenzylamine. Here, examples of the above halogen atom include a fluorine atom, a chlorine atom, a bromine atom and an iodine atom.

When the aryl group constituting the aforementioned monoaryl amines has a substituent, such an aryl group is preferably an aryl group of 6 to 10 carbon atoms having a halogen atom as a substituent, and specific examples of such monoaryl amines having a substituent include bromophenylamine. Here, examples of the above halogen atom include a fluorine atom, a chlorine atom, a bromine atom and an iodine atom.

When the alkyl group constituting the above dialkyl amines has a substituent, such an alkyl group is preferably a linear or branched alkyl group of 1 to 9 carbon atoms having a hydroxyl group or an aryl group as a substituent, and specific examples of the dialkyl amines having such substituents include diethanolamine and N-methylbenzylamine.

The above amine compound is preferably n-propylamine, n-butylamine, n-hexylamine, n-octylamine, n-dodecylamine, n-octadecylamine, sec-butylamine, tert-butylamine, 3-aminopentane, 3-methylbutylamine, 2-heptylamine, 2-aminooctane, 2-ethylhexylamine, 2-phenylethylamine, ethylenediamine, 1,3-diaminopropane, 1,4-diaminobutane, N-methyl-n-hexylamine, diisobutylamine, N-methylbenzylamine, di(2-ethylhexyl)amine, 1,2-dimethyl-n-propylamine, N,N-dimethyl-n-octadecylamine or N,N-dimethylcyclohexylamine.

Further, among these amine compounds, 2-ethylhexylamine can be mentioned as exhibiting excellent compatibility with the aforementioned silver carboxylates, being particularly suitable for increasing the concentration of the silver ink composition, and being particularly suitable for reducing the surface roughness of the conductor to be described later.

(Ammonium Salts Derived from Amine Compounds)

In the present invention, the above ammonium salt derived from an amine compound is an ammonium salt obtained by reacting the aforementioned amine compound with an acid, and the acid may be an inorganic acid, such as hydrochloric acid, sulfuric acid and nitric acid, or may be an organic acid, such as acetic acid, and the type of the acid is not particularly limited.

As the ammonium salt derived from the aforementioned amine compound, n-propylamine hydrochloride, N-methyl-n-hexylamine hydrochloride, N,N-dimethyl-n-octadecylamine hydrochloride and the like can be exemplified, although it is not limited thereto.

(Ammonium Salts Derived from Ammonia)

In the present invention, the above ammonium salt derived from ammonia is an ammonium salt obtained by reacting ammonia with an acid, and examples of the acid herein include the same as those exemplified in the case for the above ammonium salt derived from an amine compound.

As the above ammonium salt derived from ammonia, ammonium chloride and the like can be exemplified, although it is not limited thereto.

In the present invention, with respect to each of the aforementioned amine compounds, quaternary ammonium salts, ammonium salts derived from an amine compound and ammonium salts derived from ammonia, one type may be used alone or two or more types may be used in combination. When two or more types are used in combination, their combination and ratio can be adjusted arbitrarily.

Further, as the above nitrogen-containing compound, one type selected from the group consisting of the aforementioned amine compounds, quaternary ammonium salts, ammonium salts derived from an amine compound and ammonium salts derived from ammonia may be used alone or two or more types thereof may be used in combination. When two or more types are used in combination, their combination and ratio can be adjusted arbitrarily.

In the aforementioned silver ink composition, the added amount of the above nitrogen-containing compound is preferably from 0.2 to 15 moles, more preferably from 0.3 to 5 moles and particularly preferably from 0.3 to 2.5 moles, per 1 mole of the aforementioned silver carboxylate added.

By specifying the added amount of the aforementioned nitrogen-containing compound as described above, the silver ink composition can form a conductor (metallic silver) more stably, even without carrying out a heat treatment by high temperatures.

As described later, when the aforementioned silver carboxylate and the reducing compound are blended together, in the resulting mixture (silver ink composition), depending on the type of silver carboxylate or reducing compound, the formation of metallic silver is started in at least a portion of the silver carboxylate so that metallic silver is precipitated in some cases. Here, as the added amount of the nitrogen-containing compound reduces, the viscosity of the mixture (silver ink composition) increases, aggregation of the deposited metallic silver is suppressed, and the dispersibility of the metallic silver in the resulting silver ink composition is improved. A conductor obtained by forming metallic silver in a method to be described later using such a silver ink composition exhibits higher electrical conductivity (lower volume resistivity), lower surface roughness and more favorable properties than a conductor in the case of using a silver ink composition with low viscosity, that is, the composition added with a large amount of nitrogen-containing compound.

[Reducing Compound]

The aforementioned reducing compound is at least one member selected from the group consisting of oxalic acid (HOOC—COOH), hydrazine ($H_2N$—$NH_2$) and compounds (compound (5)) represented by the aforementioned general formula (5). That is, the reducing compound to be mixed may be composed only of one type or may be composed of two or more types, and when two or more types are used in combination, their combination and ratio can be adjusted arbitrarily.

In the formula, $R^{21}$ represents an alkyl group, alkoxy group or N,N-dialkylamino group of not more than 20 carbon atoms, a hydroxyl group or an amino group.

The alkyl group of not more than 20 carbon atoms represented by $R^{21}$ has 1 to 20 carbon atoms and may be any of linear, branched and cyclic, and the same alkyl groups as those described above for R in the aforementioned general formula (1) can be exemplified.

The alkoxy group of not more than 20 carbon atoms represented by $R^{21}$ has 1 to 20 carbon atoms, and a monovalent group formed by bonding the above alkyl group represented by $R^{21}$ to an oxygen atom can be exemplified.

The N,N-dialkylamino group of not more than 20 carbon atoms represented by $R^{21}$ has 2 to 20 carbon atoms, two alkyl groups bonded to the nitrogen atoms may be the same or different from each other, and each of the alkyl groups has 1 to 19 carbon atoms. However, the total value of the number of carbon atoms in these two alkyl groups is from 2 to 20.

Each of the above alkyl groups bonded to the nitrogen atom may be any one of linear, branched, and cyclic groups, and the same alkyl groups as those described above for R in the aforementioned general formula (1) can be exemplified with the exception that the number of carbon atoms is from 1 to 19.

As the aforementioned reducing compound, a monohydrate of hydrazine ($H_2N$—$NH_2.H_2O$) may be used.

The above reducing compound is preferably formic acid (H—C(=O)—OH), methyl formate (H—C(=O)—$OCH_3$), ethyl formate (H—C(=O)—$OCH_2CH_3$), butyl formate (H—C(=O)—O($CH_2$)$_3CH_3$), propanal (H—C(=O)—$CH_2CH_3$), butanal (H—C(=O)—($CH_2$)$_2CH_3$), hexanal (H—C(=O)—($CH_2$)$_4CH_3$), formamide (H—C(=O)—$NH_2$), N,N-dimethylformamide (H—C(=O)—N($CH_3$)$_2$) or oxalic acid.

In the aforementioned silver ink composition, the added amount of the above reducing compound is adjusted so that the number of moles of the carbonyl group (—C(=O)—) in the above reducing compound is preferably from 0.16 to 3 times, more preferably from 0.2 to 2.4 times, still more preferably from 0.24 to 2 times and particularly preferably from 0.5 to 2 times, the number of moles of the groups represented by the formula "—COOAg" in the aforementioned silver carboxylate. That is, in the present invention, the ratio of the number of moles of the carbonyl groups in the blended reducing compound described above with respect to the number of moles of the groups represented by the formula "—COOAg" in the blended silver carboxylate described above ([number of moles of carbonyl groups in the reducing compound]/[number of moles of groups represented by the formula "—COOAg" in the silver carboxylate], molar ratio) is preferably from 0.16 to 3, more preferably from 0.2 to 2.4, still more preferably from 0.24 to 2 and particularly preferably from 0.5 to 2. For example, in those cases where the reducing compound has one carbonyl group and the silver carboxylate has one group represented by the formula "—COOAg", the added amount of the reducing compound with respect to the added amount of the silver carboxylate is preferably set from 0.16 to 3 times by moles, more preferably from 0.2 to 2.4 times by moles, still more preferably from 0.24 to 2 by moles and particularly preferably from 0.5 to 2 times by moles.

In addition, for example, in those cases where the reducing compound has two carbonyl groups and the silver carboxylate has one group represented by the formula "—COOAg", the added amount of the reducing compound with respect to the added amount of the silver carboxylate is preferably set from 0.08 to 1.5 times by moles, more preferably from 0.1 to 1.2 times by moles, still more preferably from 0.12 to 1 times by moles and particularly preferably from 0.25 to 1 times by moles.

By specifying the added amount of the aforementioned reducing compound as described above, the silver ink composition can form a conductor (metallic silver) more stably, even without carrying out a heat treatment by high temperatures. Among the various possibilities described above, the storage stability of the silver ink composition is improved and electrical conductivity of the conductor to be described later becomes even higher, as the added amount of the above reducing compound increases. In addition, as the added amount of the above reducing compound increases, variations in the addition rate can be easily suppressed when the above reducing compound is mixed while being dropwise added as described later. It should be noted that if the above reducing compound is an acidic compound such as formic acid and oxalic acid, when the amount thereof becomes excessive, the means for depositing the silver ink composition onto a substrate such as a printing plate and a printing machine may be corroded. Therefore, in those cases where the added amount of the above nitrogen-containing compound which is usually basic is small, it is preferable to adjust the added amount of the above reducing compound so as not to be excessive.

[Other Components]

The aforementioned silver ink composition may be formed by further blending, in addition to the aforementioned silver carboxylate, the nitrogen-containing compound and the reducing compound, other components that do not fall within these categories in a range that does not impair the effects of the present invention.

The other components described above are not particularly limited and can be arbitrarily selected depending on the purpose, and one type thereof may be used alone or two or more types thereof may be used in combination. When two or more types are used in combination, their combination and ratio can be adjusted arbitrarily. Preferred examples of the other components described above include alcohols and solvents other than alcohols.

(Alcohol)

The above alcohols are preferably acetylene alcohols represented by a general formula (2) shown below (hereinafter, may be abbreviated as "acetylene alcohol (2)").

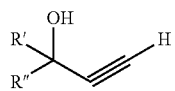

(2)

(In the formula, each of R' and R" independently represents an alkyl group of 1 to 20 carbon atoms, or a phenyl group in which one or more hydrogen atoms may be substituted with a substituent.)

In the formula, each of R' and R" independently represents an alkyl group of 1 to 20 carbon atoms, or a phenyl group in which one or more hydrogen atoms may be substituted with a substituent.

The alkyl group of 1 to 20 carbon atoms represented by R' and R" may be any one of linear, branched and cyclic groups, and may be either a monocyclic group or a polycyclic group when it is a cyclic group. Examples of the above alkyl group represented by R' and R" include the same alkyl groups as those described above for R in the aforementioned general formula (1).

Examples of the above substituent with which the hydrogen atom in the phenyl group represented by R' and R" may be substituted include a saturated or unsaturated monovalent aliphatic hydrocarbon group of 1 to 16 carbon atoms, a monovalent group formed by the aliphatic hydrocarbon group being bonded to an oxygen atom, a fluorine atom, a chlorine atom, a bromine atom, a hydroxyl group, a cyano group and a phenoxy group, which is the same as the aforementioned substituent that may substitute the hydrogen atoms in the phenyl group represented by R. Further, the number and position of the substituents are not particularly limited, and when the number of the substituent is two or more, these plurality of substituents may be the same or different from each other.

R' and R" are preferably an alkyl group of 1 to 20 carbon atoms, and more preferably a linear or branched alkyl group of 1 to 10 carbon atoms.

Preferred examples of the acetylene alcohol (2) include 3,5-dimethyl-1-hexyn-3-ol, 3-methyl-1-butyn-3-ol and 3-methyl-1-pentyn-3-ol.

In the silver ink composition, the added amount of the acetylene alcohol (2) is preferably from 0.03 to 0.7 moles and more preferably from 0.05 to 0.3 moles, per 1 mole of the aforementioned silver carboxylate added. By setting such a range, the stability of the mixture before blending the aforementioned reducing compound during the production of the silver ink composition is further improved.

(Solvent)

The aforementioned solvents are those other than the alcohols described above, and can be selected arbitrarily depending on the types and amounts of the added components.

In the aforementioned silver ink composition, a ratio of the added amount of the other components described above relative to the total amount of the added components is preferably not more than 10% by mass and more preferably not more than 5% by mass, and even when it is 0% by mass, in other words, even when the other components are not added, the silver ink composition sufficiently exhibits the effects thereof.

[Method of Producing a Silver Ink Composition]

The aforementioned silver ink composition can be obtained by blending the aforementioned silver carboxylate, the nitrogen-containing compound and the reducing compound, and, if necessary, the other components described above. After the mixing of each component, the resulting mixture may be used directly as the silver ink composition, or those obtained by subsequently performing a known purification operation, if necessary, may be used as the silver ink composition. In the present invention, at the time of mixing the above components, since impurities that inhibit the electrical conductivity are not produced or the amount of such impurities produced can be suppressed to an extremely low level, a conductor with sufficient electrical conductivity can be obtained even without carrying out a purification operation.

At the time of mixing the above components, these may be mixed after the addition of all the components, or may be mixed while adding some components sequentially, or may be mixed while sequentially adding all the components.

The mixing method is not particularly limited and may be appropriately selected from known methods, such as a method of mixing by rotating a stirring bar, a stirring blade or the like; a method of mixing by using a mixer, a three-roll mill, a kneader, a bead mill or the like; and a method of mixing by applying ultrasonic waves.

In the aforementioned silver ink composition, all the added components may be dissolved or a portion of the components may be in a dispersed state without being dissolved, but it is preferable that the added components are all dissolved, and it is preferable that the component that is not dissolved is uniformly dispersed. In the case of uniformly dispersing the components that are not dissolved, for example, it is preferable to employ a method of dispersing by using a three-roll mill, a kneader, a bead mill or the like as described above.

The temperature at the time of mixing is not particularly limited as long as the added components do not deteriorate, but it is preferably from −5 to 60° C. Further, it is preferable to appropriately adjust the temperature at the time of mixing, depending on the type and amount of the added components in order to achieve a viscosity level such that the mixture obtained by mixing can be easily stirred.

In addition, the mixing time is also not particularly limited as long as the added components do not deteriorate, but it is preferably from 10 minutes to 36 hours.

For example, when the aforementioned silver carboxylate and the reducing compound are blended together, the resulting mixture (silver ink composition) generates heat relatively easily. Further, it is assumed that when the temperature at the time of mixing these is high, since the resulting mixture will be in the same state as that of the silver ink composition at the time of heat treatment to be described later, the formation of metallic silver may start in at least a portion of the aforementioned silver carboxylate through the action of promoting the degradation of the aforementioned silver carboxylate by the aforementioned reducing compound. The silver ink composition containing such metallic silver may be able to form a conductor (metallic silver) by carrying out a post-treatment under conditions that are milder than those for the silver ink composition containing no metallic silver during the production of the conductor to be described later. In addition, also when the added amount of the reducing compound is sufficiently large, it may be possible to form a conductor by performing a post-treatment in mild conditions in the same manner. As described above, by adopting the conditions that promote the degradation of the aforementioned silver carboxylate, a conductor can be formed in some cases by a heat treatment at a lower temperature or only by a drying treatment at room temperature without carrying out a heat treatment, as a post-treatment. In addition, the silver ink composition containing such metallic silver can be handled in the same manner as the silver ink composition containing no metallic silver without particularly exhibiting poor handling properties.

In the present invention, for example, in those cases where the aforementioned silver ink composition is produced by blending the aforementioned reducing compound after mixing the aforementioned silver carboxylate and the nitrogen-containing compound, the aforementioned reducing compound is preferably mixed while being added dropwise, and there is a tendency in that the surface roughness of the conductor to be described later can be further reduced by further suppressing the variations in the addition rate.

<Conductor and a Method of Producing the Same>

A conductor according to the present invention is characterized in that it is obtained by forming metallic silver using the aforementioned silver ink composition, and is mainly composed of metallic silver. Here, the expression "mainly composed of metallic silver" means that the ratio of metallic silver is high enough to be regarded as being apparently composed only of metallic silver, and, for example, the ratio of metallic silver in the conductor is preferably at least 99% by mass.

The aforementioned conductor can be produced, for example, by depositing the silver ink composition onto a substrate and carrying out an appropriately selected post-treatment such as a drying treatment and a heat (baking) treatment. The heat treatment may be carried out so as to also serve as a drying treatment.

The substrate is preferably a film-like or sheet-like substrate, and preferably has a thickness of 10 to 5,000 μm.

The material of the substrate is not particularly limited and may be appropriately selected depending on the purpose, although more specifically, preferred examples thereof include polyethylene (PE), polypropylene (PP), polyvinyl chloride (PVC), polyvinylidene chloride (PVDC), polymethylpentene (PMP), polycycloolefin, polystyrene (PS), polyvinyl acetate (PVAc), acrylic resins such as polymethyl methacrylate (PMMA), AS resins, ABS resins, polyamide (PA), polyimide, polyamide imide (PAI), polyacetal, polyethylene terephthalate (PET), polybutylene terephthalate (PBT), poly trimethylene terephthalate (PTT), polyethylene naphthalate (PEN), polybutylene naphthalate (PBN), polyphenylene sulfide (PPS), polysulfone (PSF), polyether sulfone (PES), polyether ketone (PEK), polyether ether ketone (PEEK), polycarbonate (PC), polyurethane, polyphenylene ether (PPE), modified polyphenylene ether (m-PPE), polyarylate and synthetic resins, such as epoxy resins, melamine resins, phenol resins and urea resins.

Further, as the material of the substrate, in addition to those described above, glass, ceramics such as silicon, and paper can be exemplified.

In addition, the substrate may be composed of two or more types of materials, such as a glass epoxy resin.

The substrate may be composed of a single layer, or may be composed of multiple layers of two or more layers. When the substrate is composed of multiple layers, these multiple layers may be the same or different from each other. That is, all the layers may be the same, all the layers may be different, or only some of the layers may be different. Further, when the multiple layers are different from each other, the combination of these multiple layers is not particularly limited. Here, the expression "multiple layers are different from each other" means that at least one of the materials and thicknesses of the layers are different from each other.

It should be noted that in those cases where the substrate is composed of multiple layers, it is preferable to set the total thickness of the layers so as to achieve a favorable thickness for the substrate as described above.

The silver ink composition can be deposited onto a substrate, for example, by a known method such as a printing method, a coating method and a dipping method.

Examples of the above printing method include a screen printing method, a flexographic printing method, an offset printing method, a dip-type printing method, an inkjet-type printing method, a dispenser-type printing method, a gravure printing method, a gravure offset printing method and a pad printing method.

As the above coating method, methods using various coaters, wire bars and the like, such as a spin coater, an air knife coater, a curtain coater, a die coater, a blade coater, a roll coater, a gate roll coater, a bar coater, a rod coater and a gravure coater, can be exemplified.

The drying treatment of the silver ink composition may be carried out by a known method, and, for example, may be carried out under any conditions of normal pressure, reduced pressure and under ventilated conditions, and may be carried out either under atmospheric air or under inert gas atmosphere. Further, the drying temperature is also not particularly limited, and either drying by heating or drying at room temperature may be carried out. Preferred examples of the drying method when the heat treatment is not required include a method of drying under atmospheric air at 18 to 30° C.

When the silver ink composition is subjected to a heat treatment, the temperature at the time of heat treatment is preferably not higher than 100° C. and more preferably not higher than 90° C. The lower limit of the temperature during the heat treatment is not particularly limited as long as metallic silver can be formed efficiently, but is preferably 50° C.

In addition, the heating time may be appropriately adjusted in accordance with the heating temperature, and, for example, may be set to 0.1 to 6 hours.

The above conductor can be made in such a manner that metallic silver is sufficiently formed and the electrical conductivity is high, that is, the volume resistivity is low, and, for example, the volume resistivity can be set preferably to 2,500 μΩ·cm or less, more preferably 1,000 μΩ·cm or less and particularly preferably 300 μΩ·cm.

In addition, in the above conductor, the surface roughness can be sufficiently reduced and can be set to preferably 600 nm or less, more preferably 300 nm or less, still more preferably 250 nm or less, particularly preferably 200 nm or less and most preferably 100 nm or less.

It should be noted that in the present specification, the term "surface roughness" refers to the arithmetic average roughness (Ra), and is a value determined by the following equation, which is expressed in nanometer (nm) unit, when only the reference length is extracted from the roughness curve in the direction of the average line thereof and the roughness curve is expressed by a formula y=f(x) by taking the direction of the average line of the extracted portion as an X-axis and the direction of longitudinal magnification as a Y-axis. Hereinafter, the surface roughness may be described as "surface roughness Ra".

$$Ra = \frac{1}{l}\int_0^l |f(x)|dx$$

<Communication Device>

A communication device according to the present invention is characterized by having a conductor obtained by forming metallic silver on a substrate using the aforementioned silver ink composition, and further having the aforementioned substrate as a housing. An intermediate layer such as an ink receiving layer may be provided between the aforementioned substrate and the conductor.

Such a communication device can have the same configuration as that of the known communication devices with the exceptions that, for example, the aforementioned conductor in which a predetermined pattern has been formed is used as an antenna, and a housing is configured using the aforementioned substrate.

For example, in addition to a layered structure in which the conductor has been formed on the substrate, by combining a voice input unit, a voice output unit, an operation switch, a display unit and the like, it is possible to construct a mobile phone.

It is easier to achieve further weight reduction and thinning with the above communication device than with the conventional devices. In addition, since it is also possible to form the aforementioned conductor at a low temperature, and the materials of the substrate and the like can be selected from a wide range of materials, the degree of freedom of the design is dramatically improved, and it is also possible to configure a more rational structure.

EXAMPLES

The present invention will be described below in more detail by way of specific working Examples. However, the present invention is not limited in any way by the Examples shown below.

<Production of Silver Ink Compositions and Conductors, as Well as Evaluation of Conductors>

Example 1

Silver 2-methylacetoacetate (19.0 g) was added to 2-ethylhexylamine (11.0 g) in a beaker so that the liquid temperature was not more than 50° C., and the resulting mixture was stirred for 15 minutes using a mechanical stirrer, thereby obtaining a liquid product. Formic acid (1.22 g) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 1.

It should be noted that in Table 1, the phrase "nitrogen-containing compound (molar ratio)" refers to the added amount (number of moles) of 2-ethylhexylamine (nitrogen-containing compound) per 1 mole of the added amount of silver 2-methylacetoacetate (silver carboxylate) ([number of moles of nitrogen-containing compound]/[number of moles of silver carboxylate]). On the other hand, the phrase "reducing compound (molar ratio)" refers to the ratio of the number of moles of the carbonyl groups in the blended formic acid (reducing compound) with respect to the number of moles of the groups represented by the formula "—COOAg" in the blended silver 2-methylacetoacetate (silver carboxylate) ([number of moles of carbonyl groups in the reducing compound]/[number of moles of groups represented by the formula "—COOAg" in the silver carboxylate]). The same also applies to these phrases in the following tables.

Screen printing was carried out on a film made of polyethylene terephthalate (PET) ("Lumirror S10" manufactured by Toray Industries, Inc., thickness: 100 ηm) by using the obtained silver ink composition. As a screen plate, one made of a 500 mesh stainless steel screen was used, and a pattern with a line width of 0.5 mm and a line length of 30 mm was printed under the condition of an emulsion thickness of 10 ηm.

Then, a post-treatment was carried out by baking (heat treatment) the resulting printed pattern for 1 hour at 80° C. to form a pattern of a conductor (metallic silver).

With respect to the formed pattern, a line resistance value R ($\Omega$), a cross-sectional area A (cm$^2$) and a line length L (cm) were measured, and a volume resistivity $\rho$ ($\Omega \cdot$cm) of the pattern was calculated by the formula "$\rho$=R×A/L". It should be noted that the line resistance value R was measured using a digital multimeter ("PC5000a" manufactured by Sanwa Electric Instrument Co., Ltd.), and the cross-sectional area A was measured using a shape measuring laser microscope ("VK-X100" manufactured by Keyence Corporation). Furthermore, the surface roughness (arithmetic average surface roughness Ra) of the formed pattern was measured by using a shape measuring laser microscope ("VK-X100" manufactured by Keyence Corporation). At this time, the surface roughness was measured in accordance with JISB0601: 2001 (ISO4287, 1997) by a contour curve filter with a cut-off value of λc=0.08 mm These results are shown in Table 2.

Example 2

A silver ink composition was produced and a conductor was further produced and evaluated in the same manner as in Example 1, with the exception that the amount of formic acid blended was changed to 2.36 g instead of 1.22 g so as to achieve a molar ratio shown in Table 1. The results are shown in Table 2.

Example 3

A silver ink composition was produced and a conductor was further produced and evaluated in the same manner as in Example 1, with the exception that the amount of formic acid blended was changed to 3.15 g instead of 1.22 g so as to achieve a molar ratio shown in Table 1. The results are shown in Table 2.

Example 4

A silver ink composition was produced and a conductor was further produced and evaluated in the same manner as in Example 1, with the exception that the amount of formic acid blended was changed to 3.94 g instead of 1.22 g so as to achieve a molar ratio shown in Table 1. The results are shown in Table 2.

Example 5

A silver ink composition was produced and a conductor was further produced and evaluated in the same manner as in Example 1, with the exceptions that the amount of 2-ethylhexylamine blended was changed to 14.4 g instead of 11.0 g, the amount of silver 2-methylacetoacetate blended was changed to 15.6 g instead of 19.0 g and the amount of formic acid blended was changed to 1.21 g instead of 1.22 g so as to achieve a molar ratio shown in Table 1. The results are shown in Table 2.

Example 6

A silver ink composition was produced and a conductor was further produced and evaluated in the same manner as in Example 5, with the exception that the amount of formic acid blended was changed to 3.18 g instead of 1.21 g so as to achieve a molar ratio shown in Table 1. The results are shown in Table 2.

Example 7

A silver ink composition was produced and a conductor was further produced and evaluated in the same manner as in Example 1, with the exceptions that the amount of 2-ethylhexylamine blended was changed to 16.0 g instead of 11.0 g, the amount of silver 2-methylacetoacetate blended was changed to 13.8 g instead of 19.0 g and the amount of formic acid blended was changed to 1.21 g instead of 1.22 g so as to achieve a molar ratio shown in Table 1. The results are shown in Table 2.

Example 8

A silver ink composition was produced and a conductor was further produced and evaluated in the same manner as in Example 1, with the exceptions that the amount of 2-ethylhexylamine blended was changed to 17.4 g instead of 11.0 g and the amount of silver 2-methylacetoacetate blended was changed to 12.5 g instead of 19.0 g so as to achieve a molar ratio shown in Table 1. The results are shown in Table 2.

Example 9

A silver ink composition was produced and a conductor was further produced and evaluated in the same manner as in Example 8, with the exception that the amount of formic acid blended was changed to 2.35 g instead of 1.22 g so as to achieve a molar ratio shown in Table 1. The results are shown in Table 2.

Comparative Example 1

A silver ink composition was produced and further attempts were made to produce and evaluate a conductor in the same manner as in Example 1, with the exception that formic acid was not blended. The results are shown in Table 2.

Comparative Example 2

A silver ink composition was produced and further attempts were made to produce and evaluate a conductor in the same manner as in Example 5, with the exception that formic acid was not blended. The results are shown in Table 2.

Comparative Example 3

A silver ink composition was produced and further attempts were made to produce and evaluate a conductor in the same manner as in Example 7, with the exception that formic acid was not blended. The results are shown in Table 2.

Comparative Example 4

A silver ink composition was produced and further attempts were made to produce and evaluate a conductor in the same manner as in Example 8, with the exception that formic acid was not blended. The results are shown in Table 2.

It should be noted that in Table 1, the reference symbol "-" indicates that the component has not been blended yet, and in Table 2, the reference symbol "-" indicates that evaluation for that item has not been conducted yet.

TABLE 1

| | Blended components of silver ink composition | | |
|---|---|---|---|
| | Silver carboxylate | Nitrogen-containing compound (molar ratio) | Reducing compound (molar ratio) |
| Ex. 1 | Silver 2-methylacetoacetate | 2-ethylhexylamine (1.0) | Formic acid (0.31) |
| Ex. 2 | Silver 2-methylacetoacetate | 2-ethylhexylamine (1.0) | Formic acid (0.60) |
| Ex. 3 | Silver 2-methylacetoacetate | 2-ethylhexylamine (1.0) | Formic acid (0.80) |
| Ex. 4 | Silver 2-methylacetoacetate | 2-ethylhexylamine (1.0) | Formic acid (1.00) |
| Ex. 5 | Silver 2-methylacetoacetate | 2-ethylhexylamine (1.6) | Formic acid (0.38) |
| Ex. 6 | Silver 2-methylacetoacetate | 2-ethylhexylamine (1.6) | Formic acid (1.00) |
| Ex. 7 | Silver 2-methylacetoacetate | 2-ethylhexylamine (2.0) | Formic acid (0.42) |
| Ex. 8 | Silver 2-methylacetoacetate | 2-ethylhexylamine (2.4) | Formic acid (0.47) |
| Ex. 9 | Silver 2-methylacetoacetate | 2-ethylhexylamine (2.4) | Formic acid (0.91) |
| Comp. Ex. 1 | Silver 2-methylacetoacetate | 2-ethylhexylamine (1.0) | — |
| Comp. Ex. 2 | Silver 2-methylacetoacetate | 2-ethylhexylamine (1.6) | — |
| Comp. Ex. 3 | Silver 2-methylacetoacetate | 2-ethylhexylamine (2.0) | — |
| Comp. Ex. 4 | Silver 2-methylacetoacetate | 2-ethylhexylamine (2.4) | — |

TABLE 2

| | Conductor | | | |
|---|---|---|---|---|
| | Post-treatment temperature (° C.) | Post-treatment time (h) | Volume resistivity (μΩ·cm) | Surface roughness (nm) |
| Ex. 1 | 80 | 1 | 97 | 102 |
| Ex. 2 | 80 | 1 | 8 | 49 |
| Ex. 3 | 80 | 1 | 8 | 46 |
| Ex. 4 | 80 | 1 | 7 | 47 |
| Ex. 5 | 80 | 1 | 41 | 218 |
| Ex. 6 | 80 | 1 | 9 | 67 |
| Ex. 7 | 80 | 1 | 31 | 216 |
| Ex. 8 | 80 | 1 | 31 | 259 |
| Ex. 9 | 80 | 1 | 19 | 119 |
| Comp. Ex. 1 | 80 | 1 | >1 × 10$^7$ (Not possible to calculate) | — |
| Comp. Ex. 2 | 80 | 1 | >1 × 10$^7$ (Not possible to calculate) | — |
| Comp. Ex. 3 | 80 | 1 | >1 × 10$^7$ (Not possible to calculate) | — |
| Comp. Ex. 4 | 80 | 1 | >1 × 10$^7$ (Not possible to calculate) | — |

As shown in Tables 1 and 2, the silver ink compositions of Examples 1 to 9 were capable of forming patterns of conductors having sufficient electrical conductivity by a heat treatment even at a low heating temperature of 80° C. because of the addition of formic acid (reducing compound). In addition, the patterns of the conductors also exhibited low levels of surface roughness.

On the other hand, with the silver ink compositions of Comparative Examples 1 to 4, metallic silver was not sufficiently formed by a heat treatment at a low heating temperature of 80° C. because formic acid was not blended, and with the patterns of the resulting products of the heat treatment, the line resistance values were too large and became overloaded, the volume resistivity could not be calculated (volume resistivity was greater than 1×10$^7$ μΩ·cm) and no electrical conductivity was achieved.

Example 10

As shown in Tables 3 and 4, a silver ink composition was produced and a conductor was further produced and evaluated in the same manner as in Example 4, with the exception that the printed pattern was baked at 50° C. instead of baking (heat treatment) at 80° C. to form a pattern of a conductor (metallic silver). The results are shown in Table 4.

Example 11

As shown in Tables 3 and 4, a silver ink composition was produced and a conductor was further produced and evaluated in the same manner as in Example 4, with the exception that the printed pattern was baked for 2 hours at 50° C. instead of baking (heat treatment) for 1 hour at 80° C. to form a pattern of a conductor (metallic silver). The results are shown in Table 4.

Example 12

As shown in Tables 3 and 4, a silver ink composition was produced and a conductor was further produced and evaluated in the same manner as in Example 4, with the exception that the printed pattern was baked for 3 hours at 50° C. instead of baking (heat treatment) for 1 hour at 80° C. to form a pattern of a conductor (metallic silver). The results are shown in Table 4.

Example 13

As shown in Tables 3 and 4, a silver ink composition was produced and a conductor was further produced and evaluated in the same manner as in Example 3, with the exception that the printed pattern was left to stand for 24 hours at room temperature (23 to 25° C.) for drying instead of baking (heat treatment) for 1 hour at 80° C. to form a pattern of a conductor (metallic silver). The results are shown in Table 4.

TABLE 3

| | Blended components of silver ink composition | | |
|---|---|---|---|
| | Silver carboxylate | Nitrogen-containing compound (molar ratio) | Reducing compound (molar ratio) |
| Ex. 10 | Silver 2-methylacetoacetate | 2-ethylhexylamine (1.0) | Formic acid (1.00) |
| Ex. 11 | Silver 2-methylacetoacetate | 2-ethylhexylamine (1.0) | Formic acid (1.00) |
| Ex. 12 | Silver 2-methylacetoacetate | 2-ethylhexylamine (1.0) | Formic acid (1.00) |
| Ex. 13 | Silver 2-methylacetoacetate | 2-ethylhexylamine (1.0) | Formic acid (0.80) |

TABLE 4

| | Conductor | | | |
|---|---|---|---|---|
| | Post-treatment temperature (° C.) | Post-treatment time (h) | Volume resistivity (μΩ·cm) | Surface roughness (nm) |
| Ex. 10 | 50 | 1 | 10 | 48 |
| Ex. 11 | 50 | 2 | 7 | 58 |
| Ex. 12 | 50 | 3 | 6 | 42 |
| Ex. 13 | 23 to 25 | 24 | 9 | 67 |

As shown in Tables 3 and 4, the silver ink compositions of Examples 10 to 12 were capable of forming patterns of conductors having sufficient electrical conductivity by a heat treatment even at a heating temperature lower than that in Example 4. The volume resistivity and surface roughness of the patterns of the conductors were comparable to those in Example 4. Furthermore, in Example 13, it was possible to form a pattern of a conductor having sufficient electrical conductivity by subjecting the printed pattern only to a drying treatment without a heat treatment. This implied that in the production of the silver ink compositions, the formation of metallic silver was started by the temperature increase at the time of mixing formic acid and the action of formic acid for promoting the degradation of the silver carboxylate, the formation of metallic silver proceeded without performing a heat treatment for the silver ink composition after production, and a conductor having sufficient electrical conductivity was formed by the time the drying (removal of the solvent) was completed. Further, it was also suggested in Examples 1 to 12 that the formation of metallic silver had been started at the time of production of the silver ink compositions in the same manner.

Example 14

Silver acetoacetate (17.8 g) was added to 2-ethylhexylamine (16.5 g) in a beaker so that the liquid temperature was not more than 50° C., and the resulting mixture was stirred for 1 hour using a mechanical stirrer, thereby obtaining a liquid product. Formic acid (3.15 g) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 5.

Then, by using this silver ink composition, a conductor was produced and evaluated in the same manner as in Example 1.

The results are shown in Table 6.

Example 15

A silver ink composition was produced and a conductor was further produced and evaluated in the same manner as in Example 14, with the exception that the amount of 2-ethylhexylamine blended was changed to 11.0 g instead of 16.5 g so as to achieve a molar ratio shown in Table 5. The results are shown in Table 6.

Example 16

As shown in Table 5, a silver ink composition was produced and a conductor was further produced and evaluated in the same manner as in Example 14, with the exception that silver isobutyrylacetate (20.2 g) was used in place of silver acetoacetate (17.8 g). The results are shown in Table 6.

Example 17

As shown in Table 5, a silver ink composition was produced and a conductor was further produced and evaluated in the same manner as in Example 14, with the exceptions that silver pivaloylacetate (21.4 g) was used in place of silver acetoacetate (17.8 g), the amount of 2-ethylhexylamine blended was changed to 22.0 g instead of 16.5 g, and the stirring time after the addition of 2-ethylhexylamine was further changed to 24 hours instead of 1 hour. The results are shown in Table 6.

Example 18

2-ethylhexylamine (11.0 g) was added to silver 2-methylacetoacetate (19.0 g) in a beaker so that the liquid temperature was not more than 50° C., and the resulting mixture was stirred for 15 minutes using a mechanical stirrer, thereby obtaining a liquid product. Formic acid (3.15 g) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 5.

Then, by using this silver ink composition, a conductor was produced and evaluated in the same manner as in Example 1.

The results are shown in Table 6.

Example 19

Silver 2-methylacetoacetate (19.0 g) was added to 2-ethylhexylamine (7.7 g) in a beaker so that the liquid temperature was not more than 50° C., and the resulting mixture was stirred for 15 minutes using a mechanical stirrer, thereby obtaining a liquid product. Formic acid (2.75 g) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 5.

Then, by using this silver ink composition, a conductor was produced and evaluated in the same manner as in Example 1.

The results are shown in Table 6.

Example 20

As shown in Table 5, a silver ink composition was produced and a conductor was further produced and evaluated in the same manner as in Example 19, with the exceptions that the amount of 2-ethylhexylamine blended was changed to 4.4 g instead of 7.7 g, and the amount of formic acid blended was changed to 3.15 g instead of 2.75 g. The results are shown in Table 6.

Example 21

As shown in Table 5, a silver ink composition was produced and a conductor was further produced and evaluated in the same manner as in Example 19, with the exceptions that the amount of 2-ethylhexylamine blended was changed to 4.4 g instead of 7.7 g, and the amount of formic acid blended was changed to 2.36 g instead of 2.75 g. The results are shown in Table 6.

TABLE 5

| | Blended components of silver ink composition | | |
|---|---|---|---|
| | Silver carboxylate | Nitrogen-containing compound (molar ratio) | Reducing compound (molar ratio) |
| Ex. 14 | Silver acetoacetate | 2-ethylhexylamine (1.5) | Formic acid (0.80) |
| Ex. 15 | Silver acetoacetate | 2-ethylhexylamine (1.0) | Formic acid (0.80) |
| Ex. 16 | Silver isobutyrylacetate | 2-ethylhexylamine (1.5) | Formic acid (0.80) |
| Ex. 17 | Silver pivaloylacetate | 2-ethylhexylamine (2.0) | Formic acid (0.80) |
| Ex. 18 | Silver 2-methylacetoacetate | 2-ethylhexylamine (1.0) | Formic acid (0.80) |
| Ex. 19 | Silver 2-methylacetoacetate | 2-ethylhexylamine (0.7) | Formic acid (0.70) |
| Ex. 20 | Silver 2-methylacetoacetate | 2-ethylhexylamine (0.4) | Formic acid (0.80) |

TABLE 5-continued

Blended components of silver ink composition

| | Silver carboxylate | Nitrogen-containing compound (molar ratio) | Reducing compound (molar ratio) |
|---|---|---|---|
| Ex. 21 | Silver 2-methylacetoacetate | 2-ethylhexylamine (0.4) | Formic acid (0.60) |

TABLE 6

| | Conductor | | | |
|---|---|---|---|---|
| | Post-treatment temperature (° C.) | Post-treatment time (h) | Volume resistivity (μΩ · cm) | Surface roughness (nm) |
| Ex. 14 | 80 | 1 | 8 | 54 |
| Ex. 15 | 80 | 1 | 9 | 76 |
| Ex. 16 | 80 | 1 | 7 | 84 |
| Ex. 17 | 80 | 1 | 29 | 135 |
| Ex. 18 | 80 | 1 | 7 | 61 |
| Ex. 19 | 80 | 1 | 6 | 102 |
| Ex. 20 | 80 | 1 | 7 | 150 |
| Ex. 21 | 80 | 1 | 8 | 143 |

As shown in Tables 5 and 6, the silver ink compositions of Examples 14 to 21 were capable of forming patterns of conductors having sufficient electrical conductivity by a heat treatment even at a low heating temperature of 80° C. because of the addition of a reducing compound (formic acid) even though the types of the silver carboxylate, the added amounts of the nitrogen-containing compound and the reducing compound and the blending order of the silver carboxylate and the nitrogen-containing compound were changed. In addition, the patterns of the conductors also exhibited low levels of surface roughness.

Example 22

Silver 2-methylacetoacetate was added to 2-heptylamine (0.4-fold molar amount with respect to silver 2-methylacetoacetate described above) in a beaker so that the liquid temperature was not more than 50° C., and the resulting mixture was stirred for 15 minutes using a mechanical stirrer, thereby obtaining a liquid product. Formic acid (0.7-fold molar amount with respect to silver 2-methylacetoacetate) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 7.

Then, by using this silver ink composition, a conductor was produced and evaluated in the same manner as in Example 1.

The results are shown in Table 8.

Example 23

As shown in Table 7, a silver ink composition was produced and a conductor was further produced and evaluated in the same manner as in Example 22, with the exception that 2-aminooctane (0.4-fold molar amount with respect to silver 2-methylacetoacetate) was used in place of 2-heptylamine (0.4-fold molar amount with respect to silver 2-methylacetoacetate). The results are shown in Table 8.

Example 24

Silver acetoacetate was added to 2-ethylhexylamine (0.6-fold molar amount with respect to silver acetoacetate described above) in a beaker so that the liquid temperature was not more than 50° C., and the resulting mixture was stirred for 15 minutes using a mechanical stirrer, thereby obtaining a liquid product. Formic acid (0.8-fold molar amount with respect to silver acetoacetate) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 7.

Then, by using this silver ink composition, a conductor was produced and evaluated in the same manner as in Example 1.

The results are shown in Table 8.

Example 25

Silver caproylacetate was added to 2-ethylhexylamine (2.0-fold molar amount with respect to silver caproylacetate described above) in a beaker so that the liquid temperature was not more than 50° C., and the resulting mixture was stirred for 15 minutes using a mechanical stirrer, thereby obtaining a liquid product. Formic acid (1.0-fold molar amount with respect to silver caproylacetate) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 7.

Then, by using this silver ink composition, a conductor was produced and evaluated in the same manner as in Example 1.

The results are shown in Table 8.

It should be noted that silver caproylacetate was produced by a method shown below.

(Production of Silver Caproylacetate)

Methyl caproylacetate(methyl 3-oxooctanoate, manufactured by Nippon Fine Chemical Co., Ltd.) was added to a beaker with a volume of 500 mL while cooling in an ice-water bath (bath temperature: 3 to 5° C.) and was stirred with a magnetic stirrer. A 10% aqueous sodium hydroxide solution (70.0 g) was added dropwise thereto over a period of 5 minutes. During this time, the liquid temperature was set to be 20° C. or less. Distilled water (70.0 g) was further added thereto and stirred for 24 hours inside an incubator in which the temperature was adjusted to 20° C. Then, the obtained reaction solution was cooled to 10° C. or less, and 5% nitric acid (22.1 g) was added thereto to set the pH of the reaction solution to 5.5. Then, a 5% aqueous silver nitrate solution (476.6 g) was added into a beaker with a volume of 1,000 mL, and while stirring at a stirring rate of 350 rpm, the reaction solution described above having a pH of 5.5 was added dropwise thereto over a period of 9 minutes. During this time, the liquid temperature was 11 to 12° C. Then, from the resulting reaction solution, the precipitate produced in the reaction was centrifuged, and the resulting precipitate was washed once with water (100 mL) and then washed three times with ethanol (100 mL) and was dried under reduced pressure for 5 hours, thereby obtaining silver caproylacetate (silver β-oxooctanoate) in the form of a white powder (30.1 g).

With respect to the obtained silver caproylacetate, the structure thereof was identified, as a result of elemental analysis ("varioELIII" manufactured by Elementar Analysensysteme GmbH) which was C: 36.3% (theoretical value: 36.3%) and H: 4.9% (theoretical value: 4.9%), and as a result of measuring the heating residue after heating at 300° C. by TG/DTA (Thermogravimetry/Differential Thermal Analysis) which was 41.3% (theoretical value: 40.7%).

Example 26

Silver 2-methylacetoacetate was added to 2-ethylhexylamine (0.5-fold molar amount with respect to silver 2-methylacetoacetate described above) in a beaker so that the liquid temperature was not more than 50° C., and the resulting mixture was stirred for 15 minutes using a mechanical stirrer, thereby obtaining a liquid product. Formic acid (0.6-fold molar amount with respect to silver 2-methylacetoacetate) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 7.

Then, by using this silver ink composition, a conductor was produced and evaluated in the same manner as in Example 1.

The results are shown in Table 8.

Example 27

As shown in Table 7, a silver ink composition was produced and a conductor was further produced and evaluated in the same manner as in Example 26, with the exception that the amount of formic acid blended was changed to 0.7-fold molar amount, instead of 0.6-fold molar amount, with respect to silver 2-methylacetoacetate. The results are shown in Table 8.

Example 28

As shown in Table 7, a silver ink composition was produced and a conductor was further produced and evaluated in the same manner as in Example 26, with the exception that the amount of formic acid blended was changed to 0.8-fold molar amount, instead of 0.6-fold molar amount, with respect to silver 2-methylacetoacetate. The results are shown in Table 8.

TABLE 7

| | Blended components of silver ink composition | | |
|---|---|---|---|
| | Silver carboxylate | Nitrogen-containing compound (molar ratio) | Reducing compound (molar ratio) |
| Ex. 22 | Silver 2-methylacetoacetate | 2-heptylamine (0.4) | Formic acid (0.7) |
| Ex. 23 | Silver 2-methylacetoacetate | 2-aminooctane (0.4) | Formic acid (0.7) |

TABLE 7-continued

| | Blended components of silver ink composition | | |
|---|---|---|---|
| | Silver carboxylate | Nitrogen-containing compound (molar ratio) | Reducing compound (molar ratio) |
| Ex. 24 | Silver acetoacetate | 2-ethylhexylamine (0.6) | Formic acid (0.8) |
| Ex. 25 | Silver caproylacetate | 2-ethylhexylamine (2.0) | Formic acid (1.0) |
| Ex. 26 | Silver 2-methylacetoacetate | 2-ethylhexylamine (0.5) | Formic acid (0.6) |
| Ex. 27 | Silver 2-methylacetoacetate | 2-ethylhexylamine (0.5) | Formic acid (0.7) |
| Ex. 28 | Silver 2-methylacetoacetate | 2-ethylhexylamine (0.5) | Formic acid (0.8) |

TABLE 8

| | Conductor | | | |
|---|---|---|---|---|
| | Post-treatment temperature (° C.) | Post-treatment time (h) | Volume resistivity (μΩ·cm) | Surface roughness (nm) |
| Ex. 22 | 80 | 1 | 135 | 553 |
| Ex. 23 | 80 | 1 | 36 | 490 |
| Ex. 24 | 80 | 1 | 13 | 75 |
| Ex. 25 | 80 | 1 | 11 | 97 |
| Ex. 26 | 80 | 1 | 8 | 80 |
| Ex. 27 | 80 | 1 | 8 | 84 |
| Ex. 28 | 80 | 1 | 8 | 85 |

As shown in Tables 7 and 8, the silver ink compositions of Examples 22 to 28 were capable of forming patterns of conductors having sufficient electrical conductivity by a heat treatment even at a low heating temperature of 80° C. because of the addition of a reducing compound, even when the types of the silver carboxylate and nitrogen-containing compound and the mixing ratios of the nitrogen-containing compound and reducing compound (formic acid) were changed. In addition, the patterns of the conductors also exhibited low levels of surface roughness.

(Second Embodiment)
<<Silver Ink Composition>>

A silver ink composition according to the present invention is characterized by being formed by preparing a second mixture by supplying carbon dioxide to a first mixture formed by mixing a silver carboxylate having a group represented by a formula "—COOAg" (hereinafter, may be simply abbreviated as a "silver carboxylate") and one or more nitrogen-containing compounds selected from the group consisting of amine compounds and quaternary ammonium salts of not more than 25 carbon atoms, ammonia and ammonium salts obtained by reacting the aforementioned amine compounds or ammonia with an acid (hereinafter, may be simply abbreviated as a "nitrogen-containing compound"); and further mixing one or more reducing compounds (hereinafter, may be simply abbreviated as "reducing compound") selected from the group consisting of oxalic acid, hydrazine and compounds represented by a general formula (5) shown below (hereinafter, may be abbreviated as "compound (5)") to the aforementioned second mixture:

$$H\text{—}C(\text{=}O)\text{—}R^{21} \quad (5)$$

(in the formula, $R^{21}$ represents an alkyl group, alkoxy group or N,N-dialkylamino group of 20 or less carbon atoms, a hydroxyl group or an amino group.)

By mixing the aforementioned reducing compound, the above silver ink composition can form metallic silver more easily, and, for example, can form metallic silver (conductor) having sufficient electrical conductivity even by a heat treatment at a low temperature.

<First Mixture>

In the present invention, the aforementioned first mixture is formed by mixing the aforementioned silver carboxylate and the nitrogen-containing compound. Next, the aforementioned silver carboxylate and the nitrogen-containing compound will be described.

[Silver Carboxylate]

The silver carboxylate conforms to that described in the aforementioned first embodiment.

[Nitrogen-Containing Compound]

The nitrogen-containing compound conforms to that described in the aforementioned first embodiment.

In addition, in the aforementioned silver ink composition, the added amount of the above nitrogen-containing compound is preferably from 0.4 to 15 moles and more preferably from 0.8 to 5 moles, per 1 mole of the aforementioned silver carboxylate added.

By specifying the added amount of the aforementioned nitrogen-containing compound as described above, the silver ink composition can form a conductor (metallic silver) more stably, even without carrying out a heat treatment by high temperatures.

[Other Components at the Time of Producing a First Mixture]

The aforementioned first mixture may be formed by further blending, in addition to the aforementioned silver carboxylate and the nitrogen-containing compound, other components that do not fall within these categories in a range that does not impair the effects of the present invention.

The other components described above are not particularly limited and can be arbitrarily selected depending on the purpose, and one type thereof may be used alone or two or more types thereof may be used in combination. When two or more types are used in combination, their combination and ratio can be adjusted arbitrarily.

Preferred examples of the other components described above include alcohols and solvents other than alcohols.

(Alcohol)

The alcohol conforms to that described in the aforementioned first embodiment.

(Solvent)

The aforementioned solvents are those other than the alcohols described above, and can be selected arbitrarily depending on the types and amounts of the added components.

[Method of Producing a First Mixture]

The aforementioned first mixture can be obtained by blending the aforementioned silver carboxylate and the nitrogen-containing compound, and, if necessary, the other components described above.

At the time of mixing the above components, these may be mixed after the addition of all the components, or may be mixed while adding some components sequentially, or may be mixed while sequentially adding all the components.

The mixing method is not particularly limited and may be appropriately selected from known methods, such as a method of mixing by rotating a stirring bar, a stirring blade or the like; a method of mixing by using a mixer; and a method of mixing by applying ultrasonic waves.

In the aforementioned first mixture, all the added components may be dissolved or a portion of the components may be in a dispersed state without being dissolved, but it is preferable that the added components are all dissolved, and it is preferable that the component that is not dissolved is uniformly dispersed.

The temperature at the time of mixing is not particularly limited as long as the added components do not deteriorate, but it is preferably from −5 to 30° C. In addition, the mixing time may be appropriately adjusted in accordance with the type of added components and the temperature at the time of mixing, but, for example, it is preferably from 0.5 to 12 hours.

<Second Mixture and a Method of Producing the Same>

In the present invention, the aforementioned second mixture is formed by supplying carbon dioxide to the aforementioned first mixture.

The carbon dioxide ($CO_2$) to be supplied may be in either a gaseous form or a solid form (dry ice), or may be in both the gaseous and solid forms. Because of the supply of carbon dioxide, it is assumed that the carbon dioxide is dissolved into the first mixture and acts on the components in the first mixture, thereby increasing the viscosity of the resulting second mixture.

The supply of carbon dioxide gas may be carried out by various known methods for blowing gas into the liquid, and a suitable supply method may be selected as appropriate. For example, a method of immersing one end of a pipe into the first mixture and connecting the other end to a supplying source of carbon dioxide gas, thereby supplying the carbon dioxide gas to the first mixture through the pipe can be exemplified. At this time, the carbon dioxide gas may be supplied directly from an end portion of the pipe, or, for example, a gas diffusion member, which is made of a porous material or the like, provided with a number of void portions that can serve as a gas passage, and capable of diffusing the introduced gas and releasing as fine bubbles, is connected to the end portion of the pipe, and the carbon dioxide gas may be supplied through the gas diffusion member. In addition, the carbon dioxide gas may be supplied while stirring the first mixture by the same method employed at the time of producing the first mixture. By doing so, it is possible to efficiently supply the carbon dioxide.

The amount of carbon dioxide gas to be supplied may be appropriately adjusted in accordance with the amount of the first mixture at the supply destination and the viscosity of the intended silver ink composition or second mixture, and is not particularly limited. For example, in order to obtain about 100 to 1,000 g of a silver ink composition having a viscosity at 20 to 25° C. of at least 5 Pa·s, it is preferable to supply at least 100 L, and more preferably at least 200 L, of carbon dioxide gas. It should be noted that although the viscosity of the silver ink composition at 20 to 25° C. has been described herein, the temperature at the time of using the silver ink composition is not limited to 20 to 25° C. and can be selected arbitrarily.

The flow rate of carbon dioxide gas may be appropriately adjusted in consideration of the supply amount of carbon dioxide gas to be required, but is preferably at least 0.5 mL/min and more preferably at least 1 mL/min per 1 g of the first mixture. The upper limit value for the flow rate is not particularly limited, but is preferably 40 mL/min per 1 g of the mixture in consideration of the handling properties and the like.

Further, the supply time of carbon dioxide gas may be appropriately adjusted in consideration of the supply amount of carbon dioxide gas to be required and the flow rate.

The temperature of the first mixture at the time of supplying carbon dioxide gas is preferably from 5 to 70° C., more preferably from 7 to 60° C. and particularly preferably from 10 to 50° C. By ensuring that the temperature is equal to or more than the lower limit, carbon dioxide can be supplied more efficiently, and by ensuring that the temperature is equal to or less than the upper limit, a silver ink composition of better quality with less impurities can be obtained.

The flow rate and supply time of carbon dioxide gas as well as the above temperature during the supply of carbon dioxide gas may be adjusted to suitable ranges by mutually taking into account the respective values. For example, even when the above temperature is set to a lower value, by setting the flow rate of carbon dioxide gas to a higher value or setting the supply time of carbon dioxide gas to a longer value, or by carrying out both of these operations, carbon dioxide can be supplied efficiently. In addition, even if the flow rate of carbon dioxide gas is set to a lower value, by setting the above temperature to a higher value or setting the supply time of carbon dioxide gas to a longer value, or by carrying out both of these operations, carbon dioxide can be supplied efficiently. That is, by flexibly combining the values within the numerical range described above that are illustrated as the flow rate of carbon dioxide gas and the aforementioned temperature during the supply of carbon dioxide gas, while also taking into account the supply time of carbon dioxide gas, a silver ink composition of good quality can be obtained efficiently.

The supply of carbon dioxide gas is preferably carried out while stirring the first mixture. By doing so, the supplied carbon dioxide gas is diffused into the first mixture more uniformly, making it possible to supply the carbon dioxide more efficiently.

The stirring method at this time may be the same as the aforementioned mixing method during the first mixture preparation.

The supply of dry ice (solid carbon dioxide) may be performed by adding dry ice in the first mixture. Dry ice may be added all at once or may be divided and added in a stepwise manner (in a continuous manner interrupted by time intervals during which no addition was carried out).

The amount of dry ice used may be adjusted in consideration of the supply amount of carbon dioxide gas described above.

It is preferable to stir the first mixture during and after the addition of dry ice, and, for example, it is preferable to stir by the same method as that used during the production of the first mixture. By doing so, it is possible to efficiently supply the carbon dioxide.

The temperature during stirring may be the same as that at the time of supplying the carbon dioxide gas. In addition, the stirring time may be adjusted appropriately in accordance with the stirring temperature.

The viscosity of the second mixture may be appropriately adjusted depending on the purpose, such as the handling method of silver ink composition or second mixture, and is not particularly limited. For example, when applying the silver ink composition to a printing method using a high viscosity ink such as a screen printing method and a flexographic printing method, the viscosity of the second mixture at 20 to 25° C. is preferably at least 3 Pa·s. It should be noted that although the viscosity of the second mixture at 20 to 25° C. has been described herein, the temperature at the time of using the second mixture is not limited to 20 to 25° C. and can be selected arbitrarily.

<Silver Ink Composition>

The aforementioned silver ink composition is formed by adding the aforementioned reducing compound to the aforementioned second mixture. Next, the reducing compound will be described.

[Reducing Compound]

The reducing compound conforms to that described in the aforementioned first embodiment.

It should be noted that in the aforementioned silver ink composition, the added amount of the above reducing compound is adjusted so that the number of moles of the carbonyl group (—C(=O)—) in the above reducing compound is preferably from 0.04 to 3.5 times, more preferably from 0.06 to 2.5 times and particularly preferably from 0.08 to 1.5 times, the number of moles of the groups represented by the formula "—COOAg" in the aforementioned silver carboxylate. That is, in the present invention, the ratio of the number of moles of the carbonyl groups in the blended reducing compound described above with respect to the number of moles of the groups represented by the formula "—COOAg" in the blended silver carboxylate described above ([number of moles of carbonyl groups in the reducing compound]/[number of moles of groups represented by the formula "—COOAg" in the silver carboxylate], molar ratio) is preferably from 0.04 to 3.5, more preferably from 0.06 to 2.5 and particularly preferably from 0.08 to 1.5. For example, in those cases where the reducing compound has one carbonyl group and the silver carboxylate has one group represented by the formula "—COOAg", the added amount of the reducing compound with respect to the added amount of the silver carboxylate is preferably set from 0.04 to 3.5 times by moles, more preferably from 0.06 to 2.5 times by moles and particularly preferably from 0.08 to 1.5 times by moles. In addition, for example, in those cases where the reducing compound has two carbonyl groups and the silver carboxylate has one group represented by the formula "—COOAg", the added amount of the reducing compound with respect to the added amount of the silver carboxylate is preferably set from 0.02 to 1.75 times by moles, more preferably from 0.03 to 1.25 times by moles and particularly preferably from 0.04 to 0.75 times by moles.

By specifying the added amount of the aforementioned reducing compound as described above, the silver ink composition can form a conductor (metallic silver) more stably, even without carrying out a heat treatment by high temperatures. In addition, as the added amount of the above reducing compound increases, variations in the addition rate can be easily suppressed when the above reducing compound is mixed while being dropwise added as described later.

[Other Components at the Time of Producing a Silver Ink Composition]

The aforementioned silver ink composition may be formed by further blending, in addition to the aforementioned second mixture and the reducing compound, other components that do not fall within these categories in a range that does not impair the effects of the present invention.

The other components described above are not particularly limited and can be arbitrarily selected depending on the purpose, and one type thereof may be used alone or two or more types thereof may be used in combination. When two or more types are used in combination, their combination and ratio can be adjusted arbitrarily.

Preferred examples of the other components described above include the same as the other components to be used during the production of the first mixture. For example, the aforementioned alcohol may be blended prior to the supply of carbon dioxide, that is, only during the production of the first mixture, or may be blended after the supply of carbon dioxide, that is, only during the production of the silver ink composition, or may be blended both before and after the supply of carbon dioxide.

The viscosity of the silver ink composition may be comparable level to the viscosity of the second mixture, and, for example, when applying the silver ink composition to a printing method using a high viscosity ink such as a screen printing method and a flexographic printing method, the viscosity at 20 to 25° C. can be preferably set to 1 Pa·s or more.

[Method of Producing a Silver Ink Composition]

The aforementioned silver ink composition can be obtained by blending the aforementioned second mixture and the reducing compound, and, if necessary, the other components described above. After the mixing of each component, the resulting mixture may be used directly as the silver ink composition, or those obtained by subsequently performing a known purification operation, if necessary, may be used as the silver ink composition. In the present invention, at the time of mixing the above components, since impurities that inhibit the electrical conductivity are not produced or the amount of such impurities produced can be suppressed to an extremely low level, a conductor with sufficient electrical conductivity can be obtained even without carrying out a purification operation.

At the time of mixing the above components, these may be mixed after the addition of all the components, or may be mixed while adding some components sequentially, or may be mixed while sequentially adding all the components.

The mixing method is not particularly limited and may be appropriately selected from known methods, such as a method of mixing by rotating a stirring bar, a stirring blade or the like; a method of mixing by using a mixer, a three-roll mill, a kneader, a bead mill or the like; and a method of mixing by applying ultrasonic waves.

In the aforementioned silver ink composition, all the added components may be dissolved or a portion of the components may be in a dispersed state without being dissolved, but it is preferable that the added components are all dissolved, and it is preferable that the component that is not dissolved is uniformly dispersed. In the case of uniformly dispersing the components that are not dissolved, for example, it is preferable to employ a method of dispersing using a three-roll mill, a kneader, a bead mill or the like as described above.

The temperature at the time of mixing is not particularly limited as long as the added components do not deteriorate, but it is preferably from −5 to 60° C. Further, it is preferable to appropriately adjust the temperature at the time of mixing, depending on the type and amount of the added components in order to achieve a viscosity level such that the mixture obtained by mixing can be easily stirred.

In addition, the mixing time may be appropriately adjusted in accordance with the type of added components and the temperature at the time of mixing, but, for example, it is preferably from 0.5 to 12 hours.

As described earlier, the other components described above may be mixed during the production of either the aforementioned first mixture or the second mixture, or may be mixed during the production of both.

In the aforementioned silver ink composition, that is, in the process of producing a silver ink composition through the first mixture and the second mixture, a ratio of the added amount of the other components described above relative to the total amount of the added components excluding carbon dioxide ([other components (mass)]/[the aforementioned silver carboxylate, nitrogen-containing compound, reducing compound and other components (mass)]×100) is preferably not more than 10% by mass and more preferably not more than 5% by mass, and even when it is 0% by mass, in other words, even when the other components are not added, the silver ink composition sufficiently exhibits the effects thereof.

For example, at the time of mixing the aforementioned reducing compound, the resulting mixture (silver ink composition) generates heat relatively easily. Further, it is assumed that when the temperature at the time of mixing the aforementioned reducing compound is high, since the resulting mixture will be in the same state as that of the silver ink composition at the time of heat treatment to be described later, the formation of metallic silver may start in at least a portion of the aforementioned silver carboxylate through the action of promoting the degradation of the aforementioned silver carboxylate by the aforementioned reducing compound. The silver ink composition containing such metallic silver may be able to form a conductor (metallic silver) by carrying out a post-treatment under conditions that are milder than those for the silver ink composition containing no metallic silver during the production of the conductor to be described later. In addition, also when the added amount of the reducing compound is sufficiently large, it may be possible to form a conductor by performing a post-treatment in mild conditions in the same manner. As described above, by adopting the conditions that promote the degradation of the aforementioned silver carboxylate, a conductor can be formed in some cases by a heat treatment at a lower temperature or only by a drying treatment at room temperature without carrying out a heat treatment, as a post-treatment. In addition, the silver ink composition containing such metallic silver can be handled in the same manner as the silver ink composition containing no metallic silver without particularly exhibiting poor handling properties.

In the present invention, the aforementioned reducing compound is preferably mixed while being added dropwise, and there is a tendency in that the surface roughness of the conductor to be described later can be further reduced by further suppressing the variations in the addition rate.

It should be noted that the second mixture in the present invention exhibits a higher level of viscosity than usual due to the supply of carbon dioxide as described above. On the other hand, at the time of adding the reducing compound to the second mixture, depending on the type of the second mixture or reducing compound, the formation of metallic silver is started in at least a portion of the aforementioned silver carboxylate as described above, and metallic silver is precipitated in some cases. Here, if the viscosity of the second mixture is high, aggregation of the deposited metallic silver is suppressed, and the dispersibility of the metallic silver in the resulting silver ink composition is improved. A conductor obtained by forming metallic silver in a method to be described later using such a silver ink composition exhibits higher electrical conductivity (lower volume resistivity), lower surface roughness and more favorable properties than a conductor in the case of using a silver ink composition with low viscosity, in other words, the composition obtained by adding a reducing compound to a mixture to which no carbon dioxide has been supplied.

<<Conductor and a Method of Producing the Same>>

The conductor and the production method thereof conform to those described in the aforementioned first embodiment.

It should be noted that the silver ink composition can be deposited onto a substrate, for example, by a known method such as a printing method, a coating method and a dipping method.

Examples of the above printing method include a screen printing method, a flexographic printing method, an offset printing method, a dip-type printing method, an inkjet-type printing method, a dispenser-type printing method, a gravure printing method, a gravure offset printing method and a pad printing method, and a screen printing method and a flexographic printing method are preferred.

As the above coating method, methods using various coaters, wire bars and the like, such as a spin coater, an air knife coater, a curtain coater, a die coater, a blade coater, a roll coater, a gate roll coater, a bar coater, a rod coater and a gravure coater, can be exemplified.

The drying treatment of the silver ink composition may be carried out by a known method, and, for example, may be carried out under any conditions of normal pressure, reduced pressure and ventilated conditions, and may be carried out either under atmospheric air or under inert gas atmosphere. Further, the drying temperature is also not particularly limited, and either drying by heating or drying at room temperature may be carried out. Preferred examples of the drying method when the heat treatment is not required include a method of drying under atmospheric air at 18 to 30° C.

When the silver ink composition is subjected to a heat treatment, the temperature at the time of heat treatment is preferably not higher than 140° C. and more preferably 130° C. The lower limit of the temperature during the heat treatment is not particularly limited as long as metallic silver can be formed efficiently, but is preferably 50° C.

In addition, the heating time may be appropriately adjusted in accordance with the heating temperature, and, for example, may be set to 0.1 to 6 hours.

The above conductor can be made in such a manner that metallic silver is sufficiently formed and the electrical conductivity is high, that is, the volume resistivity is low, and, for example, the volume resistivity can be set preferably to 3,000 μΩ·cm or less and more preferably 2,500 μΩ·cm or less.

In addition, in the above conductor, the surface roughness can be sufficiently reduced, and can be set preferably to 300 nm or less, more preferably 250 nm or less, still more preferably 200 nm or less and particularly preferably 100 nm or less.

It should be noted that in the present specification, the term "surface roughness" refers to the arithmetic average roughness (Ra), and is a value determined by the following equation, which is expressed in nanometer (nm) unit, when only the reference length is extracted from the roughness curve in the direction of the average line thereof and the roughness curve is expressed by a formula y=f(x) by taking the direction of the average line of the extracted portion as an X-axis and the direction of longitudinal magnification as a Y-axis. Hereinafter, the surface roughness may be described as "surface roughness Ra".

$$Ra = \frac{1}{l}\int_0^l |f(x)|dx$$

<Communication Device>

A communication device according to the present invention is characterized by having a conductor obtained by forming metallic silver on a substrate using the aforementioned silver ink composition, and further having the aforementioned substrate as a housing. An intermediate layer such as an ink receiving layer may be provided between the aforementioned substrate and the conductor.

Such a communication device can have the same configuration as that of the known communication devices with the exception that, for example, the aforementioned conductor in which a predetermined pattern has been formed is used as an antenna, and a housing is configured using the aforementioned substrate.

For example, in addition to a layered structure in which the conductor has been formed on the substrate, by combining a voice input unit, a voice output unit, an operation switch, a display unit and the like, it is possible to construct a mobile phone.

It is easier to achieve further weight reduction and thinning with the above communication device than with the conventional devices. In addition, since it is also possible to form the aforementioned conductor at a low temperature, and the materials of the substrate and the like can be selected from a wide range of materials, the degree of freedom of the design is dramatically improved, and it is also possible to configure a more rational structure.

Examples

The present invention will be described below in more detail by way of specific working Examples. However, the present invention is not limited in any way by the working Examples shown below.

<Production of Silver Ink Compositions and Conductors, as Well as Evaluation of Conductors>

Example 29

Silver 2-methylacetoacetate (210.0 g) was added to 2-ethylhexylamine (290.3 g) in a beaker under ice cooling so as to keep the temperature at 25° C. or less, and after the completion of the addition, the resulting mixture was stirred for 30 minutes using a mechanical stirrer, thereby obtaining a solution. Furthermore, after stirring in this state for 1 hour, carbon dioxide gas was supplied for 7 hours at a flow rate of 900 mL/min to the resulting yellow transparent reaction solution (first mixture) while stirring this at 20° C., thereby obtaining a mixture (second mixture) which was a reaction solution with increased viscosity. The viscosity of the mixture was measured by the following method, which was 15 Pa·s.

Then, under ice cooling, formic acid (0.31 g) was added to the resulting mixture (30.0 g) so that the temperature of the reaction solution was not more than 50° C., and the resulting mixture was stirred for 1.5 hours at 25° C., thereby obtaining a silver ink composition. The type and amount used of the added components are shown in Table 9.

(Method of Measuring Viscosity)

With respect to an object to be measured (5 g), under the environment of a temperature of 23° C., the viscosity was measured by inserting a sensor (vibrator) of an ultrasonic vibration viscometer ("VISCOMATE VM-10A" manufactured by CBC Co., Ltd.).

It should be noted that in Table 9, the phrase "nitrogen-containing compound (molar ratio)" refers to the added amount (number of moles) of the nitrogen-containing compound (2-ethylhexylamine) per 1 mole of the added amount of the silver carboxylate (silver 2-methylacetoacetate) ([number of moles of nitrogen-containing compound]/[number of moles of silver carboxylate]). On the other hand, the phrase "reducing compound (molar ratio)" refers to the ratio of the number of moles of the carbonyl groups in the blended reducing compound (formic acid) with respect to the number of moles of the groups represented by the formula "—COOAg" in the blended silver carboxylate (silver 2-methylacetoacetate) ([number of moles of carbonyl groups in the reducing compound]/[number of moles of groups represented by the formula "—COOAg" in the silver carboxylate]).

Screen printing was carried out on a film made of polyethylene terephthalate (PET) ("Lumirror S10" manufactured by Toray Industries, Inc., thickness: 100 μm) by using the obtained silver ink composition. As a screen plate, one made of a 500 mesh stainless steel screen was used, and printing was performed under the condition of an emulsion thickness of 10 μm.

Then, a post-treatment was carried out by baking (heat treatment) the resulting printed pattern for 1 hour at 80° C. to form a pattern of a conductor (metallic silver).

With respect to the formed pattern, a line resistance value R (Ω), a cross-sectional area A (cm$^2$) and a line length L (cm) were measured, and a volume resistivity ρ (Ω·cm) of the pattern was calculated by the formula "ρ=R×A/L". It should be noted that the line resistance value R was measured using a digital multimeter ("PC5000a" manufactured by Sanwa Electric Instrument Co., Ltd.), and the cross-sectional area A was measured using a shape measuring laser microscope ("VK-X100" manufactured by Keyence Corporation). The results are shown in Table 11.

Examples 30 to 39

Silver ink compositions were produced and conductors were further produced and evaluated in the same manner as in Example 29, with the exception that the amounts of formic acid blended were changed so as to achieve molar ratios shown in Table 9. The results are shown in Table 11.

Example 40

After mixing 2-ethylhexylamine (290.3 g) and 3,5-dimethyl-1-hexyn-3-ol ("Surfynol 61" manufactured by Air Products Japan, Inc., hereinafter may be abbreviated as "DMHO") (10.0 g) in a beaker, silver 2-methylacetoacetate (210.0 g) was added thereto under ice cooling so as to keep the temperature at 25° C. or less, and after the completion of the addition, the resulting mixture was stirred for 30 minutes using a mechanical stirrer, thereby obtaining a solution. Furthermore, after stirring in this state for 1 hour, carbon dioxide gas was supplied for 6 hours at a flow rate of 900 mL/min to the resulting yellow transparent reaction solution (first mixture) while stirring this at 20° C., thereby obtaining a mixture (second mixture) which was a reaction solution with increased viscosity. The viscosity of the mixture was measured in the same manner as in Example 29, which was 10 Pa·s.

Then, under ice cooling, formic acid (1.8 g) was added to the resulting mixture (30.0 g) so that the temperature of the reaction solution was not more than 50° C., and the resulting mixture was stirred for 1.5 hours at 25° C., thereby obtaining a silver ink composition. The type and amount used of the added components are shown in Table 9.

By using the resulting silver ink composition, a conductor was produced and evaluated in the same manner as in Example 29. The results are shown in Table 11.

Example 41

A silver ink composition was produced and a conductor was further produced and evaluated in the same manner as in Example 40, with the exception that the amount of formic acid blended was changed so as to achieve a molar ratio shown in Table 9. The results are shown in Table 11.

Example 42

A conductor was produced and evaluated in the same manner as in Example 29 with the exception that the temperature at the time of baking (heat treatment) the printed pattern was changed to 100° C. instead of 80° C. The results are shown in Table 11.

Example 43

A conductor was produced and evaluated in the same manner as in Example 30 with the exception that the temperature at the time of baking (heat treatment) the printed pattern was changed to 100° C. instead of 80° C. The results are shown in Table 11.

Example 44

A conductor was produced and evaluated in the same manner as in Example 31 with the exception that the temperature at the time of baking (heat treatment) the printed pattern was changed to 100° C. instead of 80° C. The results are shown in Table 11.

Example 45

A conductor was produced and evaluated in the same manner as in Example 29 with the exception that the temperature at the time of baking (heat treatment) the printed pattern was changed to 120° C. instead of 80° C. The results are shown in Table 11.

Example 46

A conductor was produced and evaluated in the same manner as in Example 30 with the exception that the temperature at the time of baking (heat treatment) the printed pattern was changed to 120° C. instead of 80° C. The results are shown in Table 11.

Example 47

A conductor was produced and evaluated in the same manner as in Example 31 with the exception that the temperature at the time of baking (heat treatment) the printed pattern was changed to 120° C. instead of 80° C. The results are shown in Table 11.

It should be noted that in Examples 32 to 39, with respect to the formed pattern of the conductor (metallic silver), the surface roughness (arithmetic average surface roughness Ra) was further measured by using a shape measuring laser microscope ("VK-X100" manufactured by Keyence Corporation). The results are shown in Table 11.

Comparative Example 5

As shown in Table 10, a silver ink composition was produced and further attempts were made to produce and evaluate a conductor in the same manner as in Example 29, with the exception that formic acid was not blended. The results are shown in Table 11.

Comparative Example 6

Silver 2-methylacetoacetate (19.0 g) was added to 2-ethylhexylamine (11.0 g) in a beaker under ice cooling, and the resulting mixture was stirred for 30 minutes using a mechanical stirrer, thereby obtaining a silver ink composition. The type and amount used of the added components are shown in Table 10.

By using the resulting silver ink composition, attempts were made to produce and evaluate a conductor in the same manner as in Example 29. The results are shown in Table 11.

Comparative Example 3

A silver ink composition was produced and further attempts were made to produce and evaluate a conductor in the same manner as in Comparative Example 6, with the exceptions that the amount of 2-ethylhexylamine blended was changed to 14.4 g instead of 11.0 g and the amount of silver 2-methylacetoacetate blended was changed to 15.6 g instead of 19.0 g so as to achieve a molar ratio shown in Table 10. The results are shown in Table 11.

Comparative Example 8

A silver ink composition was produced and further attempts were made to produce and evaluate a conductor in the same manner as in Comparative Example 6, with the exceptions that the amount of 2-ethylhexylamine blended was changed to 16.0 g instead of 11.0 g and the amount of silver 2-methylacetoacetate blended was changed to 13.8 g instead of 19.0 g so as to achieve a molar ratio shown in Table 10. The results are shown in Table 11.

Comparative Example 9

A silver ink composition was produced and further attempts were made to produce and evaluate a conductor in the same manner as in Comparative Example 6, with the exceptions that the amount of 2-ethylhexylamine blended was changed to 17.4 g instead of 11.0 g and the amount of silver 2-methylacetoacetate blended was changed to 12.5 g instead of 19.0 g so as to achieve a molar ratio shown in Table 10. The results are shown in Table 11.

Reference Example 1

Silver 2-methylacetoacetate (19.0 g) was added to 2-ethylhexylamine (11.0 g) in a beaker so that the liquid temperature was not more than 50° C., and the resulting mixture was stirred for 15 minutes using a mechanical stirrer, thereby obtaining a liquid product. Formic acid (2.35 g) was added dropwise over a period of 30 minutes to this liquid product so that the temperature of the reaction solution was not more than 50° C. After completion of the addition of formic acid, the reaction solution was further stirred for 1.5 hours at 25° C., thereby obtaining a silver ink composition. The type and amount used of the added components are shown in Table 10.

Then, by using the resulting silver ink composition, a conductor was produced and evaluated in the same manner as in Example 29. The results are shown in Table 11.

It should be noted that in Tables 9 and 10, the reference symbol "-" indicates that the component has not been blended yet, and in Table 11, the reference symbol "-" indicates that evaluation for that item has not been conducted yet.

TABLE 9

| | Blended components of silver ink composition | | | |
|---|---|---|---|---|
| | Silver carboxylate | Nitrogen-containing compound (molar ratio) | Reducing compound (molar ratio) | Alcohol |
| Ex. 29 | Silver 2-methylacetoacetate | 2-ethylhexylamine (2.4) | Formic acid (0.10) | — |
| Ex. 30 | Silver 2-methylacetoacetate | 2-ethylhexylamine (2.4) | Formic acid (0.21) | — |
| Ex. 31 | Silver 2-methylacetoacetate | 2-ethylhexylamine (2.4) | Formic acid (0.31) | — |
| Ex. 32 | Silver 2-methylacetoacetate | 2-ethylhexylamine (2.4) | Formic acid (0.41) | — |
| Ex. 33 | Silver 2-methylacetoacetate | 2-ethylhexylamine (2.4) | Formic acid (0.52) | — |
| Ex. 34 | Silver 2-methylacetoacetate | 2-ethylhexylamine (2.4) | Formic acid (0.62) | — |
| Ex. 35 | Silver 2-methylacetoacetate | 2-ethylhexylamine (2.4) | Formic acid (0.72) | — |
| Ex. 36 | Silver 2-methylacetoacetate | 2-ethylhexylamine (2.4) | Formic acid (0.83) | — |
| Ex. 37 | Silver 2-methylacetoacetate | 2-ethylhexylamine (2.4) | Formic acid (0.93) | — |
| Ex. 38 | Silver 2-methylacetoacetate | 2-ethylhexylamine (2.4) | Formic acid (1.03) | — |
| Ex. 39 | Silver 2-methylacetoacetate | 2-ethylhexylamine (2.4) | Formic acid (1.14) | — |
| Ex. 40 | Silver 2-methylacetoacetate | 2-ethylhexylamine (2.4) | Formic acid (0.64) | DMHO |
| Ex. 41 | Silver 2-methylacetoacetate | 2-ethylhexylamine (2.4) | Formic acid (1.07) | DMHO |
| Ex. 42 | Silver 2-methylacetoacetate | 2-ethylhexylamine (2.4) | Formic acid (0.10) | — |
| Ex. 43 | Silver 2-methylacetoacetate | 2-ethylhexylamine (2.4) | Formic acid (0.21) | — |
| Ex. 44 | Silver 2-methylacetoacetate | 2-ethylhexylamine (2.4) | Formic acid (0.31) | — |

TABLE 10

| | Blended components of silver ink composition | | | |
|---|---|---|---|---|
| | Silver carboxylate | Nitrogen-containing compound (molar ratio) | Reducing compound (molar ratio) | Alcohol |
| Ex. 45 | Silver 2-methylacetoacetate | 2-ethylhexylamine (2.4) | Formic acid (0.10) | — |

TABLE 10-continued

| | Blended components of silver ink composition | | | |
|---|---|---|---|---|
| | Silver carboxylate | Nitrogen-containing compound (molar ratio) | Reducing compound (molar ratio) | Alcohol |
| Ex. 46 | Silver 2-methylacetoacetate | 2-ethylhexylamine (2.4) | Formic acid (0.21) | — |
| Ex. 47 | Silver 2-methylacetoacetate | 2-ethylhexylamine (2.4) | Formic acid (0.31) | — |
| Comp. Ex. 5 | Silver 2-methylacetoacetate | 2-ethylhexylamine (2.4) | — | — |
| Comp. Ex. 6 | Silver 2-methylacetoacetate | 2-ethylhexylamine (1.0) | — | — |
| Comp. Ex. 7 | Silver 2-methylacetoacetate | 2-ethylhexylamine (1.6) | — | — |
| Comp. Ex. 8 | Silver 2-methylacetoacetate | 2-ethylhexylamine (2.0) | — | — |
| Comp. Ex. 9 | Silver 2-methylacetoacetate | 2-ethylhexylamine (2.4) | — | — |
| Ref. Ex. 1 | Silver 2-methylacetoacetate | 2-ethylhexylamine (2.4) | Formic acid (0.91) | — |

TABLE 11

| | Conductor | | | |
|---|---|---|---|---|
| | Post-treatment temperature (° C.) | Post-treatment time (h) | Volume resistivity (μΩ·cm) | Surface roughness (nm) |
| Ex. 29 | 80 | 1 | 2044 | — |
| Ex. 30 | 80 | 1 | 262 | — |
| Ex. 31 | 80 | 1 | 59 | — |
| Ex. 32 | 80 | 1 | 38 | 74 |
| Ex. 33 | 80 | 1 | 34 | 87 |
| Ex. 34 | 80 | 1 | 28 | 63 |
| Ex. 35 | 80 | 1 | 11 | 64 |
| Ex. 36 | 80 | 1 | 9 | 59 |
| Ex. 37 | 80 | 1 | 10 | 56 |
| Ex. 38 | 80 | 1 | 10 | 51 |
| Ex. 39 | 80 | 1 | 11 | 56 |
| Ex. 40 | 80 | 1 | 20 | — |
| Ex. 41 | 80 | 1 | 14 | — |
| Ex. 42 | 100 | 1 | 129 | — |
| Ex. 43 | 100 | 1 | 47 | — |
| Ex. 44 | 100 | 1 | 12 | — |
| Ex. 45 | 120 | 1 | 7 | — |
| Ex. 46 | 120 | 1 | 11 | — |
| Ex. 47 | 120 | 1 | 8 | — |
| Comp. Ex. 5 | 80 | 1 | >1 × $10^7$ (Not possible to calculate) | — |
| Comp. Ex. 6 | 80 | 1 | >1 × $10^7$ (Not possible to calculate) | — |
| Comp. Ex. 7 | 80 | 1 | >1 × $10^7$ (Not possible to calculate) | — |
| Comp. Ex. 8 | 80 | 1 | >1 × $10^7$ (Not possible to calculate) | — |
| Comp. Ex. 9 | 80 | 1 | >1 × $10^7$ (Not possible to calculate) | — |
| Ref. Ex. 1 | 80 | 1 | 19 | 119 |

As shown in Tables 9 to 11, the silver ink compositions of Examples 29 to 47 were capable of forming patterns of conductors having sufficient electrical conductivity by a heat treatment even at a low heating temperature of 80 to 120° C. because of the addition of formic acid. In addition, the patterns of the conductors also exhibited low levels of surface roughness.

On the other hand, with the silver ink compositions of Comparative Examples 5 to 9, metallic silver was not sufficiently formed by a heat treatment at a low heating temperature of 80° C. because formic acid was not blended, and with the patterns of the resulting products of the heat treatment, the line resistance values were too large and became overloaded, the volume resistivity could not be calculated (volume resistivity was greater than 1×$10^7$ μΩ·cm) and no electrical conductivity was achieved.

It should be noted that the pattern of the conductor of Example 37 exhibited a lower volume resistivity, lower surface roughness and more favorable properties than the pattern of the conductor of Reference Example 1 that used a silver ink composition in which the type and molar ratio of the nitrogen-containing compounds as well as the type of the reducing compound were the same, the molar ratio of the reducing compound was almost the same, although the carbon dioxide gas was not supplied (that is, the viscosity was low).

Example 48

As shown in Table 12, a silver ink composition was produced and a conductor was further produced and evaluated in the same manner as in Example 29, with the exceptions that silver acetoacetate was used in place of silver 2-methylacetoacetate and the amount of formic acid blended was further changed. The results are shown in Table 13.

It should be noted that in Table 12, the phrase "nitrogen-containing compound (molar ratio)" refers to the added amount (number of moles) of the nitrogen-containing compound per 1 mole of the added amount of the silver carboxylate ([number of moles of nitrogen-containing compound]/[number of moles of silver carboxylate]). On the other hand, the phrase "reducing compound (molar ratio)" refers to the ratio of the number of moles of the carbonyl groups in the blended reducing compound with respect to the number of moles of the groups represented by the formula "—COOAg" in the blended silver carboxylate ([number of moles of carbonyl groups in the reducing compound]/[number of moles of groups represented by the formula "—COOAg" in the silver carboxylate]).

In addition, in Table 12, the reference symbol "-" indicates that the component has not been blended yet.

Example 49

As shown in Table 12, a silver ink composition was produced and a conductor was further produced and evaluated in the same manner as in Example 29, with the exceptions that silver isobutyrylacetate was used in place of silver 2-methylacetoacetate and the amount of formic acid blended was further changed. The results are shown in Table 13.

Example 50

As shown in Table 12, a silver ink composition was produced and a conductor was further produced and evaluated in the same manner as in Example 29, with the exceptions that silver pivaloylacetate was used in place of silver 2-methylacetoacetate and the amount of formic acid blended was further changed. The results are shown in Table 13.

TABLE 12

| | Blended components of silver ink composition | | | |
|---|---|---|---|---|
| | Silver carboxylate | Nitrogen-containing compound (molar ratio) | Reducing compound (molar ratio) | Alcohol |
| Ex. 48 | Silver acetoacetate | 2-ethylhexylamine (2.4) | Formic acid (0.90) | — |
| Ex. 49 | Silver isobutyrylacetate | 2-ethylhexylamine (2.4) | Formic acid (0.90) | — |
| Ex. 50 | Silver pivaloylacetate | 2-ethylhexylamine (2.4) | Formic acid (0.90) | — |

TABLE 13

| | Conductor | | | |
|---|---|---|---|---|
| | Post-treatment temperature (° C.) | Post-treatment time (h) | Volume resistivity (μΩ · cm) | Surface roughness (nm) |
| Ex. 48 | 80 | 1 | 8 | 55 |
| Ex. 49 | 80 | 1 | 9 | 65 |
| Ex. 50 | 80 | 1 | 11 | 89 |

As shown in Tables 12 to 13, the silver ink compositions of Examples 48 to 50 were capable of forming patterns of conductors having sufficient electrical conductivity by a heat treatment even at a low heating temperature of 80° C. because of the addition of formic acid. In addition, the patterns of the conductors also exhibited low levels of surface roughness. As described above, even in the case of using a silver carboxylate other than silver 2-methylacetoacetate (Examples 48 to 50), as in the case of using silver 2-methylacetoacetate (Examples 29 to 47), it was possible to form a pattern of a conductor having sufficient electrical conductivity even by a heat treatment at a low heating temperature.

INDUSTRIAL APPLICABILITY

The present invention can be used for forming a pattern of highly conductive metallic silver, such as a conductive circuit to which a printing method has been employed.

The invention claimed is:

1. A silver ink composition, which comprises:
   a silver β-ketocarboxylate having a group represented by a formula "—COAg";
   one or more monoalkyl amines having a linear or branched alkyl group of 7 or 8 carbon atoms; and
   formic acid;
   wherein said silver β-ketocarboxylate is at least one selected from the group consisting of silver β-ketocarboxylates represented by a general formula (1),

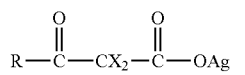

(1)

wherein R represents an aliphatic hydrocarbon group or phenyl group of 1 to 20 carbon atoms in which one or more hydrogen atoms may be substituted with a substituent, a hydroxyl group, an amino group, or a group represented by a general formula "$R^1$—$CY_2$—", "$CY_3$—", "$R^1$—CHY—", "$R^2O$—", "$R^5R^4N$—", "$(R^3O)_2CY$—" or "$R^6$—C(=O)—$CY_2$—";
wherein each Y independently represents a fluorine atom, a chlorine atom, a bromine atom or a hydrogen atom; $R^1$ represents an aliphatic hydrocarbon group of 1 to 19 carbon atoms or a phenyl group; $R^2$ represents an aliphatic hydrocarbon group of 1 to 20 carbon atoms; $R^3$ represents an aliphatic hydrocarbon group of 1 to 16 carbon atoms; each of $R^4$ and $R^5$ independently represents an aliphatic hydrocarbon group of 1 to 18 carbon atoms; and $R^6$ represents an aliphatic hydrocarbon group of 1 to 19 carbon atoms, a hydroxyl group or a group represented by a formula "AgO—";
wherein each X independently represents a hydrogen atom, an aliphatic hydrocarbon group of 1 to 20 carbon atoms, a halogen atom, a phenyl group or benzyl group in which one or more hydrogen atoms may be substituted with a substituent, a cyano group, an N-phthaloyl-3-amino-propyl group, a 2-ethoxyvinyl group or a group represented by a general formula "$R^7O$—", "$R^7S$—", "$R^7$—C(=O)—" or "$R^7$—C(=O)—O—"; and
wherein $R^7$ represents an aliphatic hydrocarbon group of 1 to 10 carbon atoms, a thienyl group, or a phenyl group or diphenyl group in which one or more hydrogen atoms may be substituted with a substituent.

2. The silver ink composition according to claim 1, wherein said formic acid is mixed with a second mixture obtained by supplying carbon dioxide to a first mixture which is obtained by mixing said silver β-ketocarboxylate and said monoalkyl amine.

3. The silver ink composition according to claim 1, wherein said silver β-ketocarboxylate is at least one member selected from the group consisting of silver 2-methylacetoacetate, silver acetoacetate, silver 2-ethylacetoacetate, silver propionylacetate, silver isobutyrylacetate, silver pivaloylacetate, silver caproylacetate, silver 2-n-butylacetoacetate, silver 2-benzylacetoacetate, silver benzoylacetate, silver pivaloylacetoacetate, silver isobutyrylacetoacetate, and silver acetonedicarboxylate.

4. The silver ink composition according to claim 2, wherein said first mixture is obtained by further mixing an acetylene alcohol represented by a general formula (2),

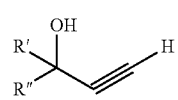

(2)

wherein each of R' and R" independently represents an alkyl group of 1 to 20 carbon atoms, or a phenyl group in which one or more hydrogen atoms may be substituted with a substituent.

5. The silver ink composition according to claim 1, wherein the monoalkyl amines are at least one selected from the group consisting of n-octylamine, 2-heptylamine, 2-aminooctane and 2-ethylhexylamine.

6. The silver ink composition according to claim 1, wherein the silver ink composition substantially consists of:

said silver β-ketocarboxylate having a group represented by a formula "—COOAg",
said one or more monoalkyl amines, and
said formic acid.

7. A conductor obtained by forming metallic silver using the silver ink composition according to claim 1.

8. A communication device comprising a conductor obtained by forming metallic silver on a substrate using the silver ink composition according to claim 1 and further comprising said substrate as a housing.

9. A silver ink composition capable of forming metallic silver formed by mixing:
a silver carboxylate having a group represented by a formula "—COOAg";
one or more nitrogen-containing compounds selected from the group consisting of amine compounds and quaternary ammonium salts of not more than 25 carbon atoms, ammonia, and ammonium salts obtained by reacting said amine compounds or ammonia with an acid;
one or more reducing compounds selected from the group consisting of oxalic acid, hydrazine and compounds represented by a general formula (5), $$H\text{—}C(\!\!=\!\!O)\text{—}R^{21} \tag{5}$$

wherein $R^{21}$ represents an alkyl group, alkoxy group or N,N-dialkylamino group of not more than 20 carbon atoms, a hydroxyl group or an amino group; and
an acetylene alcohol represented by a general formula (2),

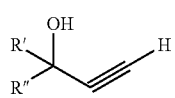
(2)

wherein each of R' and R" independently represents an alkyl group of 1 to 20 carbon atoms, or a phenyl group in which one or more hydrogen atoms may be substituted with a substituent.

10. The silver ink composition according to claim 9, wherein said reducing compound is mixed with a second mixture obtained by supplying carbon dioxide to a first mixture which is obtained by mixing said silver carboxylate and said nitrogen-containing compound.

11. The silver ink composition according to claim 9, wherein said silver carboxylate is at least one member selected from the group consisting of silver β-ketocarboxylates represented by a general formula (1) shown below and silver carboxylates represented by a general formula (4) shown below:

(1)

wherein R represents an aliphatic hydrocarbon group or phenyl group of 1 to 20 carbon atoms in which one or more hydrogen atoms may be substituted with a substituent, a hydroxyl group, an amino group, or a group represented by a general formula "$R^1\text{—}CY_2\text{—}$", "$CY_3\text{—}$", "$R^1\text{—}CHY\text{—}$", "$R^2O\text{—}$", "$R^5R^4N\text{—}$", "$(R^3O)_2CY\text{—}$" or "$R^6\text{—}C(\!\!=\!\!O)\text{—}CY_2\text{—}$";
wherein each Y independently represents a fluorine atom, a chlorine atom, a bromine atom or a hydrogen atom;

$R^1$ represents an aliphatic hydrocarbon group of 1 to 19 carbon atoms or a phenyl group; $R^2$ represents an aliphatic hydrocarbon group of 1 to 20 carbon atoms; $R^3$ represents an aliphatic hydrocarbon group of 1 to 16 carbon atoms; each of $R^4$ and $R^5$ independently represents an aliphatic hydrocarbon group of 1 to 18 carbon atoms; and $R^6$ represents an aliphatic hydrocarbon group of 1 to 19 carbon atoms, a hydroxyl group or a group represented by a formula "AgO—";

wherein each X independently represents a hydrogen atom, an aliphatic hydrocarbon group of 1 to 20 carbon atoms, a halogen atom, a phenyl group or benzyl group in which one or more hydrogen atoms may be substituted with a substituent, a cyano group, an N-phthaloyl-3-amino-propyl group, a 2-ethoxyvinyl group or a group represented by a general formula "$R^7O\text{—}$", "$R^7S\text{—}$", "$R^7\text{—}C(\!\!=\!\!O)\text{—}$" or "$R^7\text{—}C(\!\!=\!\!O)\text{—}O\text{—}$"; and wherein $R^7$ represents an aliphatic hydrocarbon group of 1 to 10 carbon atoms, a thienyl group, or a phenyl group or diphenyl group in which one or more hydrogen atoms may be substituted with a substituent,

(4)

wherein $R^8$ represents an aliphatic hydrocarbon group of 1 to 19 carbon atoms, a carboxy group or a group represented by a formula "—COOAg", and when said aliphatic hydrocarbon group has a methylene group, one or more of the methylene group may be substituted with a carbonyl group.

12. The silver ink composition according to claim 9, wherein said silver carboxylate is at least one member selected from the group consisting of silver 2-methylacetoacetate, silver acetoacetate, silver 2-ethylacetoacetate, silver propionylacetate, silver isobutyrylacetate, silver pivaloylacetate, silver caproylacetate, silver 2-n-butylacetoacetate, silver 2-benzylacetoacetate, silver benzoylacetate, silver pivaloylacetoacetate, silver isobutyrylacetoacetate, silver acetonedicarboxylate, silver pyruvate, silver acetate, silver butyrate, silver isobutyrate, silver 2-ethylhexanoate, silver neodecanoate, silver oxalate and silver malonate.

13. The silver ink composition according to claim 9, wherein said reducing compound is at least one member selected from the group consisting of formic acid, methyl formate, ethyl formate, butyl formate, propanal, butanal, hexanal, formamide, N,N-dimethylformamide and oxalic acid.

14. A silver ink composition capable of forming metallic silver formed by mixing: a silver carboxylate having a group represented by a formula "—COOAg";
one or more nitrogen-containing compounds selected from the group consisting of amine compounds and quaternary ammonium salts of not more than 25 carbon atoms, ammonia, and ammonium salts obtained by reacting said amine compounds or ammonia with an acid; and
one or more reducing compounds selected from the group consisting of oxalic acid, hydrazine and compounds represented by a general formula (5),

(5)

wherein R²¹ represents an alkyl group, alkoxy group or N,N-dialkylamino group of not more than 20 carbon atoms, a hydroxyl group or an amino group, and wherein said reducing compound is mixed with a second mixture obtained by supplying carbon dioxide to a first mixture which is obtained by mixing said silver carboxylate and said nitrogen-containing compound.

15. The silver ink composition according to claim 14, wherein said silver carboxylate is at least one member selected from the group consisting of silver β-ketocarboxylates represented by a general formula (1) shown below and silver carboxylates represented by a general formula (4) shown below:

(1)

wherein R represents an aliphatic hydrocarbon group or phenyl group of 1 to 20 carbon atoms in which one or more hydrogen atoms may be substituted with a substituent, a hydroxyl group, an amino group, or a group represented by a general formula "R¹—CY₂—", "CY₃—", "R¹—CHY—", "R²O—", "R⁵R⁴N—", "(R³O)₂CY—" or "R⁶—C(=O)—CY₂—";

wherein each Y independently represents a fluorine atom, a chlorine atom, a bromine atom or a hydrogen atom; R¹ represents an aliphatic hydrocarbon group of 1 to 19 carbon atoms or a phenyl group; R² represents an aliphatic hydrocarbon group of 1 to 20 carbon atoms; R³ represents an aliphatic hydrocarbon group of 1 to 16 carbon atoms; each of R⁴ and R⁵ independently represents an aliphatic hydrocarbon group of 1 to 18 carbon atoms; and R⁶ represents an aliphatic hydrocarbon group of 1 to 19 carbon atoms, a hydroxyl group or a group represented by a formula "AgO—";

wherein each X independently represents a hydrogen atom, an aliphatic hydrocarbon group of 1 to 20 carbon atoms, a halogen atom, a phenyl group or benzyl group in which one or more hydrogen atoms may be substituted with a substituent, a cyano group, an N-phthaloyl-3-amino-propyl group, a 2-ethoxyvinyl group or a group represented by a general formula "R⁷O—", "R⁷S—", "R⁷—C(=O)—" or "R⁷—C(=O)—O—";

wherein R⁷ represents an aliphatic hydrocarbon group of 1 to 10 carbon atoms, a thienyl group, or a phenyl group or diphenyl group in which one or more hydrogen atoms may be substituted with a substituent,

(4)

wherein R⁸ represents an aliphatic hydrocarbon group of 1 to 19 carbon atoms, a carboxy group or a group represented by a formula "—COOAg", and when said aliphatic hydrocarbon group has a methylene group, one or more of the methylene group may be substituted with a carbonyl group.

16. The silver ink composition according to claim 14, wherein said silver carboxylate is at least one member selected from the group consisting of silver 2-methylacetoacetate, silver acetoacetate, silver 2-ethylacetoacetate, silver propionylacetate, silver isobutyrylacetate, silver pivaloylacetate, silver caproylacetate, silver 2-n-butylacetoacetate, silver 2-benzylacetoacetate, silver benzoylacetate, silver pivaloylacetoacetate, silver isobutyrylacetoacetate, silver acetonedicarboxylate, silver pyruvate, silver acetate, silver butyrate, silver isobutyrate, silver 2-ethylhexanoate, silver neodecanoate, silver oxalate and silver malonate.

17. The silver ink composition according to claim 14, wherein said reducing compound is at least one member selected from the group consisting of formic acid, methyl formate, ethyl formate, butyl formate, propanal, butanal, hexanal, formamide, N,N-dimethylformamide and oxalic acid.

18. The silver ink composition according to claim 14, wherein said first mixture is obtained by further mixing an acetylene alcohol represented by a general formula (2) shown below:

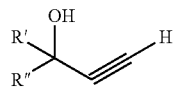
(2)

wherein each of R' and R" independently represents an alkyl group of 1 to 20 carbon atoms, or a phenyl group in which one or more hydrogen atoms may be substituted with a substituent.

19. The silver ink composition according to claim 1, wherein the substituents when R, X, or R⁷ represents an aliphatic hydrocarbon group are independently selected from the group consisting of a fluorine atom, a chlorine atom, and a bromine atom;

the substituents when R represents a phenyl group are selected from the group consisting of a saturated or unsaturated monovalent aliphatic hydrocarbon group of 1 to 16 carbon atoms, a monovalent group formed by the aliphatic hydrocarbon group being bonded to an oxygen atom, a fluorine atom, a chlorine atom, a bromine atom, a hydroxyl group, a cyano group, and a phenoxy group;

the substituents when X represents a phenyl group or a benzyl group are selected from the group consisting of a fluorine atom, a chlorine atom, a bromine atom, an iodine atom, and a nitro group; and the substituents when R⁷ represents a phenyl or diphenyl group are independently selected from the group consisting of a fluorine atom, a chlorine atom, a bromine atom and an iodine atom.

20. The silver ink composition according to claim 9, wherein the substituents when R' or R" represents an alkyl group of 1 to 20 carbon atoms are selected from the group consisting of a fluorine atom, a chlorine atom, and a bromine atom; and the substituents when R' or R" represents a phenyl group are selected from the group consisting of a saturated or unsaturated monovalent aliphatic hydrocarbon group of 1 to 16 carbon atoms, a monovalent group formed by the aliphatic hydrocarbon group being bonded to an oxygen atom, a fluorine atom, a chlorine atom, a bromine atom, a hydroxyl group, a cyano group and a phenoxy group.

* * * * *